US008885334B1

(12) United States Patent
Baxter

(10) Patent No.: US 8,885,334 B1
(45) Date of Patent: Nov. 11, 2014

(54) COMPUTING SYSTEM WITH NETWORK ATTACHED PROCESSORS

(75) Inventor: Glenn A. Baxter, Longmont, CO (US)

(73) Assignee: Xilinx, Inc., San Jose, CA (US)

(*) Notice: Subject to any disclaimer, the term of this patent is extended or adjusted under 35 U.S.C. 154(b) by 765 days.

(21) Appl. No.: 13/045,461

(22) Filed: Mar. 10, 2011

(51) Int. Cl.
*H05K 5/00* (2006.01)
*H05K 7/00* (2006.01)
*G06F 1/16* (2006.01)

(52) U.S. Cl.
USPC ............... 361/679.32; 361/679.31; 361/728

(58) Field of Classification Search
USPC ............... 361/679.31, 679.32, 728, 737, 748
See application file for complete search history.

(56) References Cited

U.S. PATENT DOCUMENTS

| | | | |
|---|---|---|---|
| 5,963,746 A | 10/1999 | Barker et al. | |
| 6,460,122 B1 | 10/2002 | Otterness et al. | |
| 7,913,022 B1 * | 3/2011 | Baxter | 710/305 |
| 7,971,793 B2 * | 7/2011 | Nishizawa et al. | 235/492 |
| 2003/0018868 A1 | 1/2003 | Chung | |
| 2004/0044876 A1 | 3/2004 | Settles | |
| 2004/0141294 A1 * | 7/2004 | Wakabayashi et al. | 361/719 |
| 2005/0188149 A1 | 8/2005 | Kaler | |
| 2008/0084674 A1 * | 4/2008 | Silverbrook et al. | 361/739 |
| 2008/0104344 A1 | 5/2008 | Shimozono et al. | |
| 2008/0123305 A1 * | 5/2008 | Amidi et al. | 361/737 |
| 2008/0201574 A1 | 8/2008 | Haneda | |

OTHER PUBLICATIONS

Nass, Rich, "Xilinx puts ARM Core into its FPGAs", EE Times, 2 pp., printed from website on Jan. 31, 2011, http://www.eetimes.com/electronics-products/processors/4115523/Xilinx-puts-ARM-core-into-its-FPGAs.
Intel Corporation, "Intel Offers Configurable Atom E600C Processor on Altera FPGA", Nov. 23, 2010, 1 page, printed from website Jan. 18, 2011, http://benchmarkreviews.com/index.php?options+com_content&task+view&id=12891<e.
Intel Corporation, "Intel Atom Processor E6x5C Series-Based Platform for Embedded Computing", Platform Brief, Intel Atom Processor E6x5C Series, Embedded Computing,.4 pp, created Dec. 2010, http://download.intel.com/embedded/processors/prodbrief/324535.pdf.
U.S. Appl. No. 12/329,993, filed Dec. 8, 2008, Baxter, Glenn A., Xilinx, Inc. 2100 Logic Drive, San Jose, CA 95124.

* cited by examiner

*Primary Examiner* — Anthony Haughton
(74) *Attorney, Agent, or Firm* — Kevin T. Cuenot

(57) ABSTRACT

A processor module can include a circuit board, a first programmable circuitry coupled to the circuit board, wherein the first programmable circuitry is configurable to implement different physical circuits, and a processor configured to execute program code. The processor can be coupled to the circuit board and to the first programmable circuitry. The processor module also can include random access memory (RAM) devices coupled to the circuit board and electrically coupled to the first programmable circuitry. The RAM devices can be coupled to the first programmable circuitry to form parallel channels of the RAM devices. The processor module further can include an interface coupled to the circuit board and electrically coupled to the first programmable circuitry for coupling input and output between the first programmable circuitry and external circuitry.

14 Claims, 15 Drawing Sheets

COMPUTING SYSTEM WITH NETWORK ATTACHED PROCESSORS

FIELD OF THE INVENTION

One or more embodiments disclosed within this specification relate to a network attached processor system. More particularly, one or more embodiments relate to a network attached processor system having a form factor that facilitates high density of computing resources.

BACKGROUND

Enterprise class computing systems are adequate for a variety of applications. In situations where very large data sets must be stored and/or processed, however, existing enterprise class computing systems can prove to be inadequate. Conventional enterprise computing systems are typically implemented using a massive array of computers, e.g., servers, coupled together to form a network. This approach does succeed in providing a large amount of computational power.

The resulting computing system, however, has disadvantages including, but not limited to, consumption of a large amount of physical space, consumption of a significant amount of power, and the need for a massive amount of cooling. Each of these disadvantages results in increased operating cost. As more services migrate from individual computer systems to network-based services often referred to as "cloud computing," the disadvantages of conventional enterprise class computing systems are likely to grow in significance.

SUMMARY

One or more embodiments disclosed within this specification relate to a network attached processor system and, more particularly, to a network attached processor system having a form factor that facilitates high density of computing resources.

An embodiment can include a processor module. The processor module can include a circuit board and a first programmable circuitry coupled to the circuit board. The first programmable circuitry is configurable to implement different physical circuits. The processor module also can include a processor configured to execute program code, wherein the processor is coupled to the circuit board and to the first programmable circuitry. The processor module further can include a plurality of random access memory (RAM) devices coupled to the circuit board and electrically coupled to the first programmable circuitry. The plurality of RAM devices can be coupled to the first programmable circuitry to form a plurality of parallel channels of the plurality of RAM devices. The processor module further can include an interface coupled to the circuit board and electrically coupled to the first programmable circuitry for coupling input and output between the first programmable circuitry and external circuitry.

Another embodiment can include a computing system. The computing system can include a first circuit board, a plurality of sockets coupled to the first circuit board, and a connector coupled to each of the plurality of sockets configured to couple the plurality of sockets to external circuitry. The computing system can include a plurality of processor modules. Each of the processor modules can be disposed within one of the plurality of sockets. Each of the processor modules can include a second circuit board, a first programmable circuitry, and a processor configured to execute program code. The first programmable circuitry can be coupled to the second circuit board and configured to implement different physical circuits. The processor can be coupled to the second circuit board and to the first programmable circuitry. The processor module also can include a plurality of RAM devices coupled to the second circuit board and electrically coupled to the first programmable circuitry. The plurality of RAM devices can be coupled to the first programmable circuitry to form a plurality of parallel channels of the plurality of RAM devices. The processor module further can include an interface electrically coupled to the second circuit board and to the first programmable circuitry. Each interface can be configured to couple into one of the plurality of sockets Another embodiment can include a rack system for a computing system. The rack system can include a plurality of plenums configured to direct conditioned air and a plurality of vertically stacked and horizontally oriented enclosures, wherein each of the plurality of enclosures is coupled between the plurality of plenums using slide rails. The plurality of plenums can direct the conditioned air into the plurality of enclosures.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

Figure 1A:
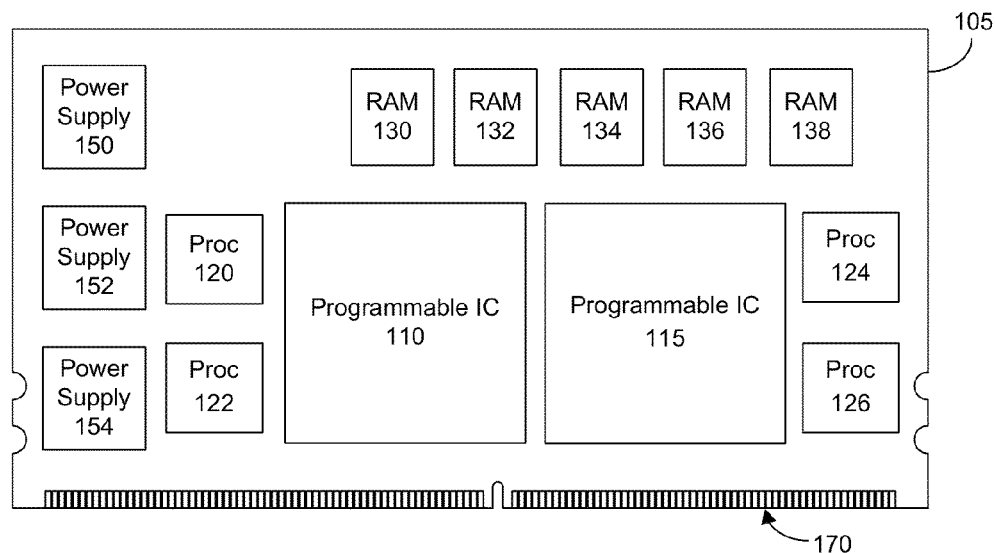
FIG. 1A is a physical diagram illustrating a front side of a processor module in accordance with an embodiment disclosed within this specification.

FIG. 1A is a physical diagram illustrating a front side of a processor module 100 in accordance with an embodiment disclosed within this specification. Processor module 100 can include a circuit board 105 and one or more programmable integrated circuits (ICs) 110 and 115. In an embodiment, programmable ICs 110 and 115 can be implemented as field programmable gate arrays (FPGAs) attached to circuit board 105.

Programmable ICs are a type of IC that can be programmed to perform specified logic functions. One type of programmable IC, the FPGA, typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM such as configuration flash 160) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD typically includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology.

The phrase "programmable IC" can include, but is not limited to these devices and further can encompass devices that are only partially programmable. For example, one type of programmable IC can include a combination of hard-coded transistor logic and a programmable switch fabric that programmably interconnects the hard-coded transistor logic. In another example, a programmable IC can include an application-specific integrated circuit (ASIC) that includes at least some programmable circuitry, e.g., a hardware programmable structure.

Processor module 100 further can include one or more processors 120-126, random access memories (RAMs) 130-138, and one or more power supplies 150-154 each being attached to the front face of circuit board 105. Each of processors 120-126 can be implemented as a single core central processing unit (CPU) or a multi-core CPU. In one or more embodiments, each of processors 120-126 can be implemented as a multi-core, e.g., a dual-core, CPU that is compliant with the IA-32 (Intel® Architecture, 32-bit) and/or IA-64 (Intel® Architecture, 64-bit) architecture. Processors that are compatible with the IA-32 and/or IA-64 architectures generally are referred to as "x86" processors and can execute the instruction set corresponding to each respective architecture.

In one or more embodiments, each of processors 120-126 can be implemented as a mobile processor that is configured to consume reduced power as compared to other classes of processors typically found within desktop and/or server types of computing systems. For example, each of processors 120-126 can be implemented as an Intel® Z550 Atom™ CPU, which includes two cores and provides reduced power consumption. It should be appreciated, however, that the particular examples and models provided within this specification are not intended to be limiting of the one or more embodiments disclosed.

Each of RAMs 130-138 can be implemented as any of a variety of RAM devices. For example, each of RAMs 130-138 can be implemented as a dynamic RAM device. In another example, each of RAMs 130-138 can be implemented as a DDR3 SDRAM type of memory device operating at 1066 MHz. In an embodiment, each of RAMs 130-138 can be connected to circuit board 105 using BGA96 type of connectors or form factors. For example, each of RAMs 130-138 can provide up to approximately ½ GB of memory for a total of up to approximately 5 GB of memory on circuit board 105.

Power supplies 150-154 can provide the voltage sources necessary for operation of the various components attached to circuit board 105 as described within this specification. Each of power supplies 150-154 can receive a reference voltage as input and generate one or more different and stable voltages, e.g., voltage sources, as output to be distributed throughout circuit board 105. For example, a 5 volt voltage can be received as input and a plurality of different voltages ranging between 0.1 to 5 volts can be generated as output. In an embodiment, each of power supplies 150-154 can be implemented as an LTM4616 Dual 8A per channel low VIN DC/DC μModule available from Linear Technology of Milpitas, Calif.

As shown, processor module 100 also can include an interface 170. Interface 170 is electrically coupled to programmable ICs 110 and 115 and power supplies 150-154. Accordingly, interface 170 facilitates coupling of inputs and outputs between programmable ICs 110 and 115 and power supplies 150-154 and external circuitry. In an embodiment, interface 170 can be implemented as a card-edge connector that is configured to couple to a socket. Accordingly, processor module 100, and more particularly interface 170, can be inserted into a socket (e.g., socket 402 to be described herein with reference to FIG. 4) for adding processors to a computing system. Similarly, processors can be removed from the system by removing processor module 100 from the socket.

In an embodiment, programmable ICs 110 and 115, processors 120-126, RAMs 130-138, and power supplies 150-154 can be soldered to circuit board 105. Traces can be formed on circuit board 105 electrically connecting programmable ICs 110 and 115, processors 120-126, RAMs 130-138, and power supplies 150-154 among one another. Traces on circuit board 105 further can electrically couple programmable IC 110 and 115 and power supplies 150-154 to interface 170. For example, interface 170 can be directly coupled to power supplies 150-154 and to programmable ICs 110 and 115.

In one embodiment, processors 120-126 can be coupled to interface 170 only through programmable IC 110 and/or programmable IC 115. In that case, communications between processors 120-126 and circuits and/or systems external to circuit board 105 can flow through programmable IC 110 and/or programmable IC 115 via interface 170. In another embodiment, one or more or all pins of processors 120-126 can couple to interface 170 directly via traces on circuit board 105 bypassing programmable IC 110 and 115. For example, all of pins of processors 120-126 can couple directly to interface 170. In another example, some of pins of processors 120-126 can couple directly to interface 170 via traces and bypass programmable ICs 110 and 115 while other ones of pins of processors 120-126 can couple to interface 170 through programmable ICs 110 and 115.

Throughout this specification, traces are described as being "on" a circuit board. As used within this specification, the phrases "on circuit board," "on the circuit board," or derivatives thereof, can refer to traces that are implemented on a circuit board, to traces implemented within a circuit board, e.g., in the case of a multi-layer circuit board where traces are implemented on layers other than the top layer, or both. In this regard, the phrases "on circuit board," "on the circuit board," or derivatives thereof are not intended to be limiting of the particular implementation or location of traces of a circuit board.

Figure 1B:
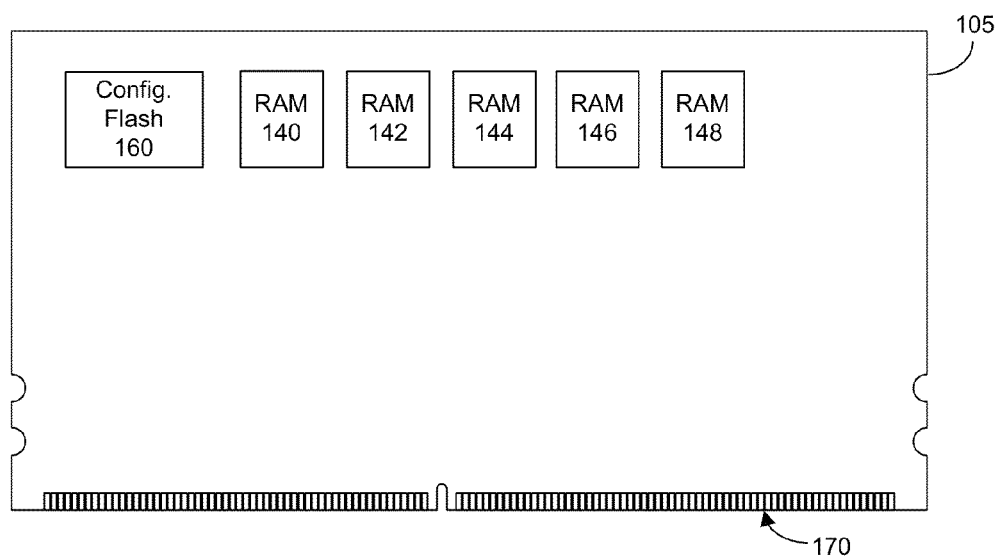
FIG. 1B is a physical diagram illustrating a back side of the processor module of FIG. 1A in accordance with another embodiment disclosed within this specification.

FIG. 1B is a physical diagram illustrating a back side of processor module 100 of FIG. 1A in accordance with another embodiment disclosed within this specification. As shown, the back side of processor module 100, e.g., the side opposite the front side illustrated in FIG. 1A, can include one or more additional RAMs 140-148 and one or more flash memory devices shown as configuration flash 160.

RAMs 140-148 can be implemented and attached to circuit board 105 in substantially the same manner as RAMs 130-138 described with reference to FIG. 1. RAMs 130-148 can be coupled to programmable IC 110 and/or programmable IC 115. In one or more embodiments, RAMs 130-148 can be coupled to programmable IC 110 and/or programmable IC 115 to form one or more parallel channels of RAM.

In an embodiment, configuration flash 160 can be dedicated to storing configuration data for configuring programmable IC 110 and/or programmable IC 115. Configuration flash 160 can be implemented as a single packaged 64 gigabyte flash memory die that is soldered to circuit board 105. Alternatively, configuration flash 160 can be implemented as multiple flash dies having more or less than 64 gigabytes of capacity that that can be configured to act or function as a single channel of flash memory. In any case, configuration flash 160 can be coupled to each of programmable ICs 110 and 115 via a plurality of traces on circuit board 105.

In another embodiment, configuration flash 160 can store program code that is usable by processors 120-126 as well as any processors that may be implemented within programmable IC 110 and/or programmable IC 115. Processors implemented within programmable IC 110 and/or programmable IC 115 can be implemented as hard or soft processors. The program code can include, but is not limited to, for one or more or all processors, an operating system, one or more applications, data for use by the processor(s), or any combination thereof. It should be appreciated that the same program code (e.g., operating systems, applications, and data) can be stored within configuration flash 160 for each processor or processor type. In another example, different, e.g., processor-specific, program code can be stored within configuration flash 160 so that each processor can be loaded with one or more different program code implementations (operating systems, applications, or the like). Within this specification, program code and configuration data can be collectively referred to as "module configuration data."

Figure 2:
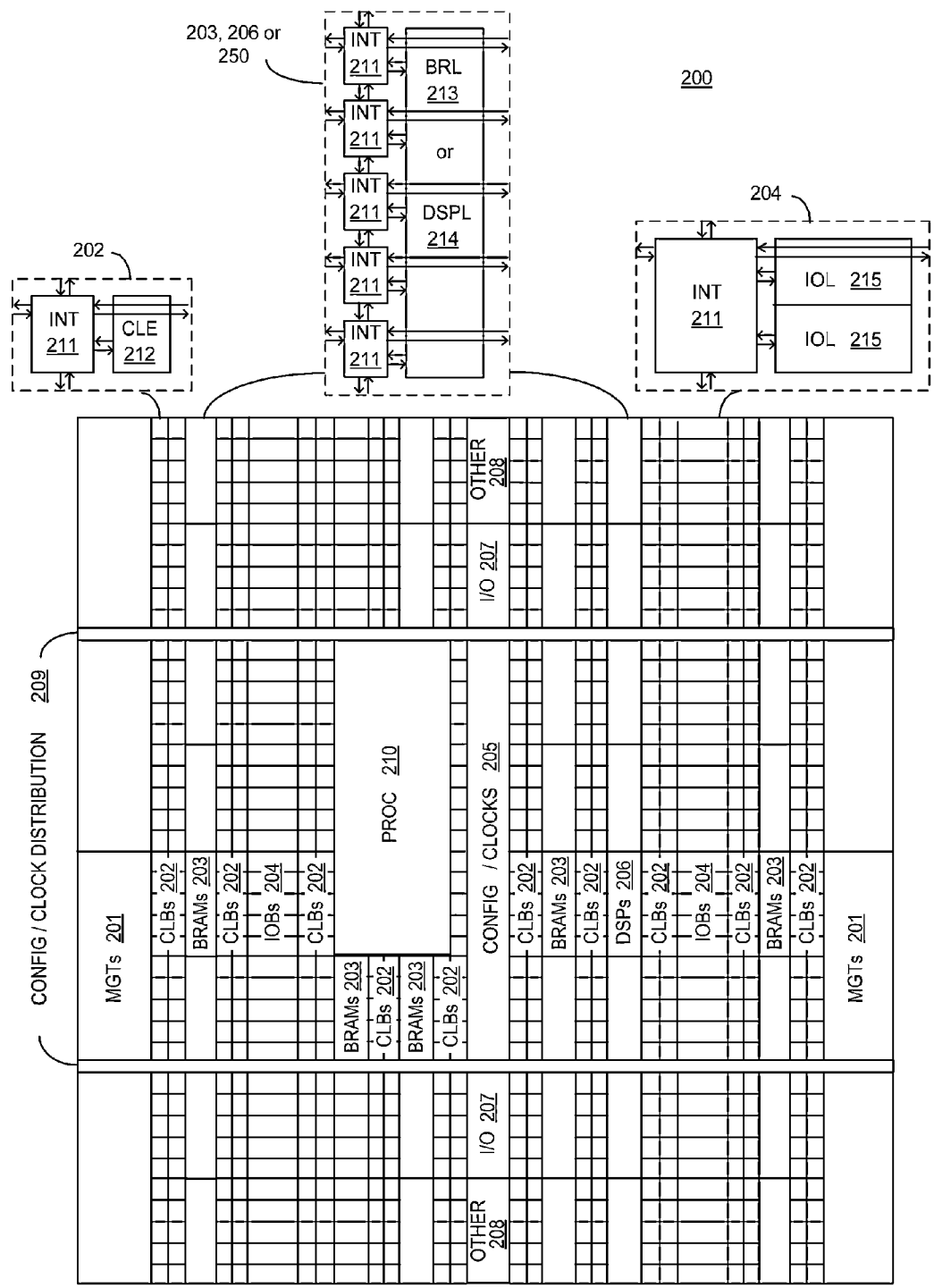
FIG. 2 is a block diagram illustrating a programmable integrated circuit in accordance with another embodiment disclosed within this specification.

FIG. 2 is a block diagram illustrating a programmable IC in accordance with another embodiment disclosed within this specification. FIG. 2 illustrates an example of an architecture that can be used to implement programmable IC 110, programmable IC 115, or both of FIG. 1A. For purposes of illustration, FIG. 2 is described with reference to programmable IC 110. As noted, however, the architecture described with reference to FIG. 2 can be used to implement programmable IC 115.

As shown, programmable IC 110 can be implemented as an FPGA having an FPGA architecture 200 that includes different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks DSPs 206, specialized input/output blocks (I/O) 207 (e.g., configuration ports and clock ports), interface tiles (PHYs) 250 and other programmable logic 208 such as digital clock managers, analog-to-digital converters, system monitoring logic, and so forth.

In addition, programmable IC 110 may include one or more dedicated processor blocks (PROC) 210 and/or an encryption logic block (not shown). For example, PROC 210 can be implemented in the form of a PowerPC™ type of microprocessor or CPU. In another example, PROC 210 can be implemented as a microprocessor that is compliant with the IA-32 and/or IA-64 architecture. In either case, PROC 210 can execute program code and interact with the surrounding programmable circuitry.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 2 that are external to PROC 210 can constitute the programmable circuitry or part of the programmable circuitry of the IC.

In this regard, the execution of program code as performed by PROC 210, for example, is distinguishable from "programming" or "configuring" programmable circuitry that may be available on an IC. The act of programming or configuring programmable circuitry of an IC results in the implementation of different physical circuitry as specified by the configuration data within the programmable circuitry.

For example, the programmable circuitry can be configured to implement one or more different physical circuits, e.g., user circuit designs specified by the configuration data loaded into the programmable circuitry. It should be appreciated that programmable circuitry, with the exception of various hard-wired circuits that can be implemented therein, is not operational or functional until configuration data is loaded within configuration memory causing physical circuitry to be implemented within the programmable circuitry.

In the example shown, PROC 210 is implemented on the same substrate as the programmable circuitry. In other configurations, however, PROC 210 can be implemented within the same IC package as the programmable circuitry, albeit with PROC 210 being implemented on a first die and the programmable circuitry being implemented on a second die communicatively coupled to the first die within the IC package.

In some FPGAs, each programmable tile includes a programmable interconnect element (INT) 211 having standardized connections to and from a corresponding interconnect element in each adjacent tile. Therefore, the programmable interconnect elements taken together implement the programmable interconnect structure for the illustrated FPGA. Each INT 211 also can include the connections to and from the programmable logic element within the same tile, as shown by the examples included at the top of FIG. 2.

For example, a CLB 202 can include a configurable logic element (CLE) 212 that can be programmed to implement user logic plus a single programmable interconnect element (INT) 211. A BRAM 203 can include a BRAM logic element (BRL) 213 in addition to one or more INTs 211. Typically, the number of INTs 211 included in a tile depends on the height of the tile. As pictured in FIG. 2, a BRAM tile has the same height as five CLBs, but other numbers (e.g., six) can also be used. A DSP tile 206 can include a DSP logic element (DSPL) 214 in addition to an appropriate number of programmable interconnect elements. An IOB 204 can include, for example, two instances of an input/output logic element (IOL) 215 in addition to one instance of an INT 211. As will be clear to those of skill in the art, the actual I/O pads connected, for example, to IOLs 215, are manufactured using metal layered above the various illustrated logic blocks, and typically are not confined to the area of IOLs 215.

As shown in FIG. 2, a columnar area near the center of the die (shown shaded in FIG. 2) is used for configuration, clock, and other control logic. Horizontal areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks can be programmable blocks and/or dedicated logic. For example, PROC 210 shown in FIG. 2 spans several columns of CLBs and BRAMs. For purposes of illustration, only one processor block is shown. In another embodiment, programmable IC 110 can include two or more PROCs 210.

FIG. 2 is intended to illustrate an exemplary FPGA architecture. For example, the numbers of logic blocks in a column, the relative width of the columns, the number and order of columns, the types of logic blocks included in the columns, the relative sizes of the logic blocks, the incorporation of hard blocks such as PROC 210, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. Further, in another embodiment, programmable ICs 110 and/or 115 need not include any hard processor blocks.

Figure 3:
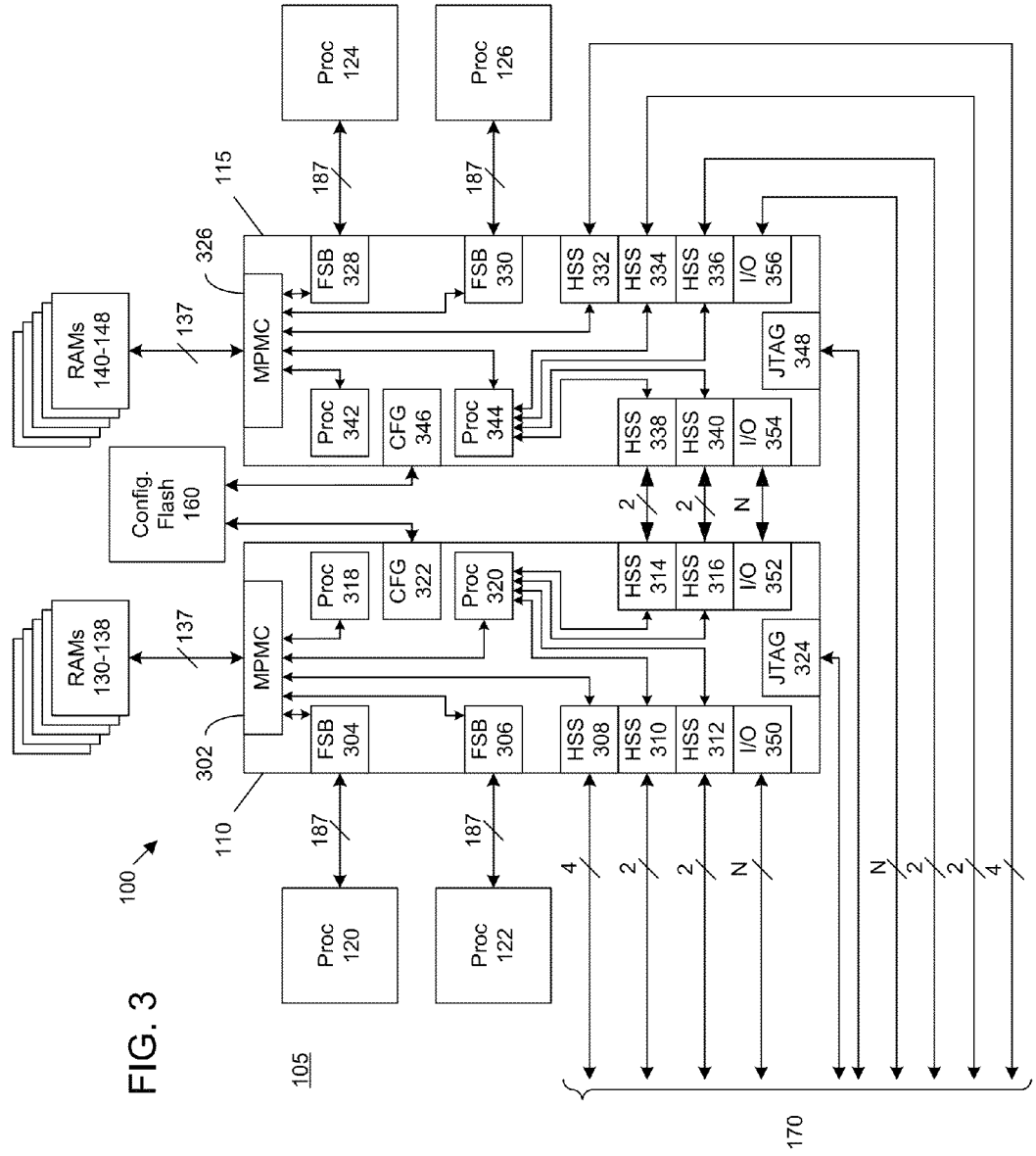
FIG. 3 is a block diagram illustrating the processor module of FIG. 1 in accordance with another embodiment disclosed within this specification.

FIG. 3 is a block diagram illustrating processor module 100 of FIG. 1 in accordance with another embodiment disclosed within this specification. FIG. 3 illustrates an exemplary configuration in which programmable ICs 110 and 115 are implemented using FPGAs. Accordingly, each of programmable ICs 110 and 115 can be configured to provide functions such as logic, control, and interface capabilities that conventional systems lack. For example, hard circuit blocks such as multi-gigabyte transceivers (MGTs 201), CPUs (PROC 210), and encryption logic blocks, can be provided by programmable ICs 110 and 115 and utilized to facilitate I/O functions for processor module 100 of FIG. 1.

In one or more embodiments, programmable ICs 110 and 115 each can be implemented as an XC5VFXT130FFG1136 Virtex-5 FXT FPGA device (Virtex-5 FXT) manufactured by Xilinx®, Inc. of San Jose, Calif. (hereafter "Xilinx"). The Virtex-5 FXT, for example, contains built-in hard, e.g., hard-wired, cores including, but not limited to, PowerPC™ 440 CPUs, multi-gigabit transceivers, block random access memory, digital signal processors, CRC error checkers, tri-mode Ethernet media access controllers, and Peripheral Component Interconnect express (PCIe) interfaces.

As shown, each of programmable ICs 110 and 115 can be configured with a circuit design that instantiates circuit blocks including one or more Front Side Bus (FSB) interfaces, one or more multi-port memory controllers (MPMCs), and a plurality of high speed serial (HSS) interfaces. For purposes of illustration, a single MPMC is illustrated within each of programmable ICs 110 and 115. It should be appreciated, however, that more than one MPMC can be implemented within either one or both of programmable ICs 110 and 115 as may be desired to take advantage of the multiple parallel channels of RAMs 130-138 and/or 140-148. The circuit designs loaded into each of programmable ICs 110 and 115 from configuration flash 160 further can utilize hard circuit block processors existing within each of programmable IC 110 and 115.

Accordingly, programmable IC 110, once loaded with a circuit design from configuration flash 160, can be configured to include MPMC 302, FSB interfaces 304 and 306, HSS interfaces 308-316, and processors 318-320. Programmable IC 110 also can include a configuration port (CFG) 322 that can be coupled to configuration flash 160 and a JTAG port 324. Programmable IC 110 further can include "N" individual I/O pins denoted as I/O 350 and I/O 352. The letter "N" is used to indicate an integer value greater than or equal to one.

Similarly, programmable IC 115, once loaded with a circuit design from configuration flash, can include MPMC 326, FSB interfaces 328 and 330, HSS interfaces 332-340, and processors 342-344. Programmable IC 115 also can include a configuration port (CFG) 346 that can be coupled to configuration flash 160 and a JTAG port 348. Programmable IC 115 can include "N" individual I/O pins denoted as I/O 354 and I/O 356. Circuit blocks such as the multi-gigabyte transceivers and the like can be used, for example, to implement HSS interfaces 308-316 and 332-340. Processor 318, 320, 342, and 344 can be hard processors such as the PowerPC 440 CPU.

It should be appreciated that, depending upon the particular type of programmable IC used, processors 318 and 320, for example, can be implemented as a single processor, e.g., a single PowerPC™ 440 CPU. In another embodiment, processors 318 and 320 can be implemented as a soft processor that is implemented within the programmable circuitry available within programmable IC 110. For example, the circuit design loaded into programmable IC 110 via configuration port 322 can specify a soft-processor such as the MicroBlaze™ soft processor available from Xilinx®. Similarly, processors 342 and 344 can be implemented as a hard processor or as a soft processor depending upon the particular type of programmable IC used.

One or more MPMCs 302 can be configured to communicate with RAMs 130-138 via approximately 137 I/Os available on programmable IC 110. Each of the I/Os can be coupled to connections on RAMs 130-138 via traces on circuit board 105 of processor module 100. In an embodiment, the approximately 137 I/Os can be configured into a plurality of different parallel channels, e.g., five, of RAM memory. For example, the I/Os can be configured to form an individual channel for each of RAMs 130-138 coupled to the one or more MPMCs 302. With five independent and parallel channels, each of RAMs 130-138 can communicate with the one or more MPMCs 302 over a dedicated channel. Because RAMs 130-138 are completely separated in their interfaces to programmable IC 110, each of RAMs 130-138 can be operated independently of other ones of RAMs 130-138. This allows for sophisticated power management schemes where different channels of RAMs can be powered on or off, placed in low power mode, and/or have the clock rates of the channel(s) of RAM changed, with each of the aforementioned measures being implemented independently of each other channel of RAMs. The use of multiple, parallel channels can reduce the bandwidth of each channel compared to an embodiment where multiple, parallel channels are not used, but provides advantages in other respects. For example, multiple, parallel channels of RAM facilitates reduced latency and increased parallelism that arises due, at least in part, to the ability to initiate different transactions to different physical addresses concurrently over the multiple, parallel channels.

One or more MPMCs 326 can be configured to communicate with RAMs 140-148 via approximately 137 I/Os available on programmable IC 115. Each of the I/Os can be coupled to connections on RAMs 140-148 via traces on circuit board 105. In an embodiment, the approximately 137 I/Os can be configured into a plurality of different parallel channels, e.g., five, of RAM memory. As noted, the I/Os can be configured to form an individual channel for each of RAMs 140-148 coupled to the one or more MPMCs 326. With five independent and parallel channels, each of RAMs 140-148 can communicate with the one or more MPMCs 302 over a dedicated channel. Because RAMs 140-148 are completely separated in their interfaces to programmable IC 115, each of RAMs 140-148 can be operated independently of other ones of RAMs 140-148. As noted, multiple parallel channels of RAM allows sophisticated power management schemes to be implemented, reduced latency, and increased parallelism.

One or more inputs and/or outputs of programmable IC 110 collectively denoted as configuration port (CFG) 322 can be coupled to configuration flash 160 through one or more traces on circuit board 105. Likewise, one or more inputs and/or outputs of programmable IC 115 collectively denoted as configuration port (CFG) 346 can be coupled to configuration flash 160 through one or more traces on circuit board 105. Each of programmable ICs 110 and 115 can be coupled to configuration flash 160 through any of a variety of mechanisms, whether serial or parallel interfaces. In an embodiment, each of programmable ICs 110 and 115 can have approximately 47 I/Os dedicated for communication with configuration flash 160.

It should be appreciated that while each of programmable ICs 110 and 115 are shown as being coupled to configuration flash 160, in another embodiment, configuration flash 160 can be coupled to one of programmable ICs 110 or 115. For example, configuration flash 160 can be coupled to programmable IC 110 as a master that can control configuration of each respective programmable IC 110 and 115. Programmable IC 110 can be coupled to programmable IC 115, which can function as a slave in this example, via a parallel or a serial communication link to convey module configuration data or configuration data received from configuration flash 160 to programmable IC 115.

In an embodiment, configuration flash 160 can be implemented as a single packaged IC die, for example, a NOR-based flash device, that is large enough to store module configuration data. As noted, module configuration data can include configuration data for programmable ICs 110 and/or 115, e.g., multiple copies or versions of the bitstreams used to configure programmable ICs 110 and 115. Module configuration data further can include program code for processors 120-126 and for processors 318, 320, 342, and 344, for example. Alternatively, configuration flash 160 can include more than one IC die, either implemented as separately packaged dies or as a multi-chip module that includes more than one physical die.

Each of programmable ICs 110 and 115 can be configured to manage the configuration process and choose which set of configuration data to load. Further, each of programmable ICs 110 and 115 can manage configuration, e.g., boot, of processors 120-126, 318, 320, 342, and/or 344. In this regard, programmable IC 110 and/or 115 can select a set of program code to be loaded for each of processors 120-126, 318, 320, 342, and/or 344 as a group or on an individual basis, for example, responsive to various events or other stimuli such as received requests.

For example, the determination as to which portion of module configuration data to load can be based upon one or more pins of interface 170 and/or configuration modes set within each of programmable ICs 110 and/or 115 during normal operation. In this regard, each of programmable ICs 110 and 115 can include multi-boot capability allowing known good configuration data for each of programmable ICs 110 and 115 to be loaded. Responsive to loading and implementing the known good configuration data specifying a circuit design within one or both of programmable ICs 110 and/or 115, the programmable IC(s) can obtain a new or second and different set of configuration data to be loaded into one or both of programmable ICs 110 and/or 115. In such an embodiment, if the new configuration data is determined to be defective, one or both of programmable ICs 110 and 115 can reload the original known good configuration data. This ability to fail-safe to a known good set of configuration data permits high reliability systems to be built using processor module 100.

In an embodiment, configuration flash 160 can be programmed at the factory before being soldered to circuit board 105 or can be programmed after being placed on processor module 100, either before being shipped to a customer or after being shipped to the customer. The ability to program configuration flash 160 after being placed on circuit board 105 allows for in system programming. So called "in system programming" allows for module configuration data to be updated after processor module 100 has been deployed in a system, e.g., in the field. For example, the original equipment manufacturer (OEM) may wish to charge additional revenue to enable a particular feature on processor module 100. Enabling a particular feature can be accomplished by the end customer purchasing a particular set of module configuration data. For example, the OEM can provided a tool to program the new feature into configuration flash 160 for subsequent implementation within programmable ICs 110 and/or 115 and/or processors 120-126, 318, 320, 342, and/or 344.

One or more inputs and/or outputs of programmable IC 110 collectively denoted as JTAG port 324 can be coupled to interface 170 via one or more traces on circuit board 105. As known, JTAG (Joint Action Test Group) port 324 represents an IEEE 1149.1 Standard Test Access Port and Boundary-Scan Architecture. Likewise, one or more inputs and/or outputs of programmable IC 115, collectively denoted as JTAG port 348, can be coupled to interface 170 via one or more traces on circuit board 105.

Though not shown in FIG. 3, one or more or all of processors 120-126, 318, 320, 328, and 330 can include a JTAG port that can be utilized for debugging purposes. In one embodiment, each JTAG port of each of processors 120-126, 318, 320, 328, and 330 can be coupled independently to interface 170 via traces on circuit board 105. In another embodiment, JTAG ports can be shared. For example, processors 318 and 320 can share JTAG port 324 of programmable IC 110. Similarly, processors 342 and 344 can share JTAG port 348 of programmable IC 115. In another example, programmable IC 110 can include an additional JTAG port that can be used to communicate with the JTAG port of each of processors 120 and 122. Likewise, programmable IC 115 can include an additional JTAG port that can be used to communicate with the JTAG port of each of processors 124 and 126. Those skilled in the art will appreciate that any of a variety of different techniques can be used to couple the JTAG ports of processors 120-126, 318, 320, 328, and 330 and that the one or more embodiments disclosed within this specification are not intended to be limited by the examples shown. Further, though described as JTAG ports, it should be appreciated that any of a variety of different ports for debugging can be used in lieu of JTAG, e.g., another serial port.

In another embodiment, each of processors 120-126, 318, 320, 328, and 330 can include a trace port (not shown). The trace ports can be coupled individually to interface 170 or can be combined as described with reference to the JTAG ports and debugging ports above. For example, when trace ports are combined, data can be encapsulated and sent from processor module 100 via a centralized port. Again, the one or more embodiments disclosed within this specification are not intended to be limited to the particular examples provided.

As shown, each of HSS interfaces 308-312 and 332-336 can be coupled to interface 170 via traces on circuit board 105. Examples of HSS interfaces that can be implemented can include, but are not limited to, Gigabit Ethernet such as 10 Gigabit Ethernet with TCP/IP Offload Engine (TOE), PCIe, Serial Advanced Technology Attachment (SATA), Infini-Band, or the like. The examples listed are not intended to limit the different varieties of HSS interfaces that can be used. Similarly, I/O 350 can represent "N" I/Os of programmable IC 110 that can be directly coupled to interface 170 through traces on circuit board 105. I/O 356 can represent "N" I/Os of programmable IC 115 that can be directly coupled to interface 170 through traces on circuit board 105.

Communication between programmable IC 110 and programmable IC 115 can be performed through one or more HSS interfaces dedicated for inter-IC communication. As pictured, HSS interface 314 of programmable IC 110 can be coupled to HSS interface 338 via a plurality of traces on circuit board 105. Similarly, HSS interface 316 of programmable IC 110 can be coupled to HSS interface 340 of programmable IC 115 via a plurality of traces on circuit board 105. I/O 352 can represent "N" I/Os of programmable IC 110 that can be directly coupled to "N" I/Os of programmable IC 115 denoted as I/O 354 through one or more traces on circuit board 105.

Within programmable IC 110, HSS interfaces 310-316 can be coupled to processor 320. HSS interface 308 can be coupled directly to MPMC 302. Processors 318 and 320 are coupled to MPMC 302, thereby allowing each of processors 318 and 320 access to RAMs 130-138. Within programmable IC 115, HSS interfaces 334-340 can be coupled to processor 344. HSS interface 332 can be coupled directly to MPMC 326. Processors 342 and 344 are coupled to MPMC 324, thereby allowing each of processors 340 and 342 access to RAMs 140-148. It should be appreciated that while the connections illustrated within programmable ICs 110 and 115 are shown as direct connections, the various blocks, e.g., HSS interfaces, FSBs, processors, and the like can be coupled via one or more buses, a combination of direct connections and buses, other intervening IP blocks, or the like. The configurations shown are provided for purposes of illustration only and are not intended as limitations of the embodiments disclosed within this specification.

As noted, one or both of programmable ICs 110 and 115 can include an offload engine, e.g., a TCPIP offload engine (not shown). The offload engine can be coupled to one of the HSS interfaces and/or incorporated within one or more of the HSS interfaces. The offload engine can be configured, for example, to communicate with a switch (e.g., switch 440*a* to be described with reference to FIG. 4). The offload engine can de-capsulate received data to remove and/or interpret the header, and possibly any footer information, of the data. Similarly, the offload engine can encapsulate data for sending data. The offload engine further can be configured to analyze the content, e.g., payload, of the data to determine what to do with the received data. The offload engine can store payloads or whole packets to RAMs 130-138 and/or RAMs 140-148 as well as provide the payloads or whole packets to processors, e.g., processors 120-126, 318, 320, 324, and/or 344. For example, the offload engine can include one or more buffers within which data and/or packets can be stored and from which one or more of the processors can retrieve the data and/or packets.

The offload engine can be implemented in any of a variety of forms including a purely hardware implementation or as a mix of hardware and software. For example, an offload engine can be implemented as a circuit block, e.g., a soft block, using the programmable circuitry of programmable IC 110 and/or programmable IC 115. In another example, any one or more of processors 318, 320, 342, and/or 344 can be used to implement an offload engine by executing appropriate program code. In another example, one or more of processors 120-126 can be configured to operate as an offload engine.

Other techniques for optimization of the offload engine can be utilized. For example, some transactions can be handled using a hardware implementation, e.g., a dedicated offload engine circuit block. Other transactions, however, can be handled by an additional offload engine that is implemented using one of the processors 120-126, 318, 320, 342, and/or 344.

Each FSB interface 304, 306, 328, and 330 can be dedicated to communicating with one of processors 120-126 respectively. Thus, FSB 304 of programmable IC 110 is coupled to processor 120 through a plurality of traces on circuit board 105. FSB 306 of programmable IC 110 is coupled to processor 122 through a plurality of traces on circuit board 105. FSB interfaces 304 and 306 are coupled to MPMC 302 to provide each of processors 120 and 122 access to RAMs 130-138. Similarly, FSB 328 of programmable IC 115 is coupled to processor 124 through a plurality of traces on circuit board 105. FSB 330 of programmable IC 115 is coupled to processor 126 through a plurality of traces on circuit board 105. FSB interfaces 328 and 330 are coupled to MPMC 326 to provide each of processors 124 and 126 access to RAMs 140-148. In another embodiment, one or more of the FSB interfaces of programmable IC 110 and/or programmable IC 115 can be used to facilitate, or allow for, coupling of debug and/or trace capability of processors 120-126, 318, 320, 342, and/or 344, for example, by JTAG. Again, as noted, while the connections illustrated within programmable ICs 110 and 115 are shown as direct connections, the various blocks illustrated can be coupled via one or more buses, a combination of direct connections and buses, other intervening IP blocks, or the like. The configurations shown are provided for purposes of illustration only and are not intended as limitations of the embodiments disclosed within this specification.

It should be appreciated that various other IP blocks such as interrupt controllers, real time clocks, and the like (not shown) can be advantageously used to build a high performance system. Designers typically trade off various performance, thermal, and power requirements to decide best what special blocks to include. For example, IP blocks can be include that allow one of the processors of processor module 100 to control the power of power supplies 150-154 to effectuate more efficient control over power usage.

As noted, each of programmable ICs 110 and 115 can include a plurality of multi-gigabit transceivers, e.g., 12 MGTs, coupled to pins of the device. The multi-gigabit transceivers can be configured to implement any of a variety of different interfaces as described within this specification. For example, the multi-gigabit transceivers can be configured to implement 3 channels of ten gigabit Ethernet, 12 channels of one gigabit Ethernet, 12 channels of Serial Attached SCSI (Small Computer Systems Interface), or 12 channels of Serial Advanced Technology Attachment (SATA or serial ATA). Moreover, in a configuration where multiple processor modules are used, the multi-gigabit transceivers, the HSS interfaces, and/or the user input/output pins can be used to cross communicate between processor modules. Further, MGTs can be channel bonded to create wider and higher bandwidth serial interfaces.

In an embodiment, interface 170 can include a variety of other pins that can couple to one or both of programmable ICs 110 and 115. These pins are not shown for purposes of illustration. In any case, the pins can connect to one or both of programmable ICs 110 and 115 via traces on circuit board 105. For example, interface 170 can include one or more clock pins and one or more configuration pins that can couple to one or both of programmable ICs 110 and 115. Clock signals can be received by programmable ICs 110 and/or 115 as well as generated and output from programmable ICs 110 and/or 115 via interface 170. Module configuration data then can be loaded into each of programmable ICs 110 and/or 115 via the configuration pins and/or stored within configuration flash 160 by programmable IC 110 and/or programmable IC 115. Interface 170 also can include a plurality of user-definable pins that can connect to one or both of programmable ICs 110 and 115.

In an embodiment, each of programmable ICs 110 and 115 can include encryption logic that is a specialized hard circuit block that permits encrypted configuration data to be decrypted. A key is required to be loaded into programmable IC 110 and/or programmable IC 115 in order to support, e.g., decrypt, encrypted configuration data. When power to programmable IC 110 or to programmable IC 115 is removed, the key is erased, e.g., lost, from the particular programmable IC that loses power. In another embodiment, however, a suitable battery back-up can be provided or placed on circuit board 105 that prevents the key from being deleted in the event of a power loss. In any case, when the key is deleted, any encrypted configuration data or module configuration data is useless and cannot be used to configure either of programmable ICs 110 and/or 115 or any of processors 120-128, 318, 320, 342, or 344.

In another embodiment, in addition to or independently of the encryption previously described, additional decryption circuitry can be implemented within the programmable circuitry of the programmable ICs in the form of soft circuit blocks. The decryption circuitry can obfuscate the implementation of circuitry within each programmable IC. This allows different physical implementations of functionally equivalent circuits to be implemented within the programmable ICs thereby obfuscating the circuitry. Because the soft decryption circuit blocks can be updated or changed, e.g., via dynamic partial reconfiguration, the obfuscation techniques used can be changed or updated dynamically, routinely, or from time-to-time. This allows the physical circuitry to be protected through obfuscation, e.g., establishing different routing and/or relocating circuit blocks to different locations within the programmable IC(s), in addition to simply encrypting the bitstream.

Accordingly, in another embodiment, a battery can be attached to circuit board 105 to prevent loss of the key. In another embodiment in which a battery is not mounted on circuit board 105, one or more dedicated I/Os of programmable IC 110 and/or programmable IC 115 can couple to encryption battery pins of interface 170 rather than a battery mounted on circuit board 105. In one example, decryption can be performed by each of programmable ICs 110 and 115 independently. In another example, one master programmable IC can be tasked with decryption of the bitstreams and pass the decrypted module configuration data, e.g., potentially a bitstream, to the other programmable IC. In any case, when processor module 100 is removed from its socket, the key is deleted from programmable ICs 110 and/or 115 when a battery is not mounted to circuit board 105. In that case, processor module 100 is rendered unusable until a correct key is loaded.

Programmable ICs 110 and 115 can be configured to implement a number of different input and/or output standards. One skilled in the art will understand that the I/O pins of programmable ICs 110 and 115 can be used in a wide variety of ways including as differential and single ended signals, as well as unidirectional or bi-directional signals depending upon the requirements of the system. Accordingly, processor module 100 allows for a significant capability to add signaling to processor module 100 that is simply not present in current other implementations that utilize dual in-line memory module (DIMM) architectures.

As discussed, FIG. 3 illustrates an example of an architecture that can be implemented for processor module 100. Processor module 100 is described as being implemented on a circuit board. In another embodiment, however, one or more processors, e.g., processors 120-124, can be implemented within the same IC package or upon a same substrate as the programmable circuitry, e.g., as the FPGA. In an embodiment, for example, one or more of processors 318, 320, 342, and/or 344 can be implemented as IA-32 and/or IA-64 compliant architectures.

FIG. 3 is provided as an example for purposes of illustration and is not intended as a limitation of the one or more embodiments disclosed within this specification. In another embodiment, for example, each of RAMs 130-138 and 140-148 can be coupled to each of programmable ICs 110 and 115 via traces on circuit board 105. In that case, each of RAMs 130-138 and 140-148 can be available to each of programmable ICs 110 and 115. The programmable nature of programmable ICs 110 and 115 further allows multiple MPMCs to be implemented within either one or both of programmable ICs 110 and 115. For example, each of programmable ICs 110 and 115 can be configured, e.g., programmed or re-programmed, to include five MPMCs that can be coupled to various ones of RAMs 130-138 and 140-148. In another example, one or more of RAMs 130-138 and 140-148 can be coupled to an MPMC within programmable IC 110 and also to another MPMC within programmable IC 115 to facilitate access to a same RAM by each of programmable ICs 110 and 115.

The ability to dynamically configure or reconfigure some or all of each of programmable ICs 110 and 115 allows one to implement and vary, during operation, the particular system architecture that is used as module 100 continues to operate. For example, some or all of programmable IC 110 can be reconfigured to implement different physical circuits while programmable IC 115 continues to operate uninterrupted. Subsequently, some or all of programmable IC 115 can be reconfigured to implement different physical circuits while programmable IC 110 continues to operate uninterrupted.

Figure 4A:
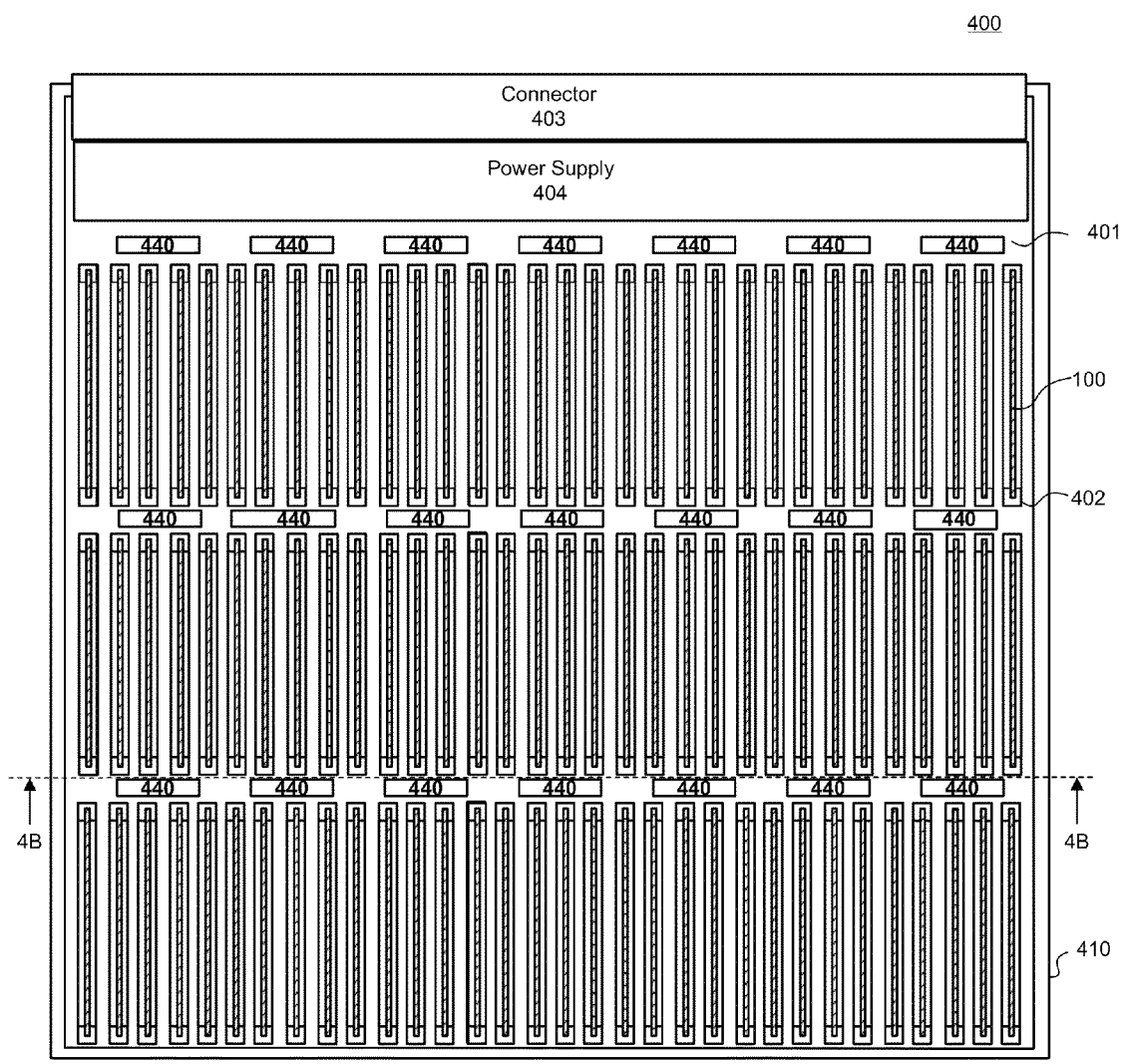
FIG. 4A is a mechanical diagram illustrating a system in accordance with another embodiment disclosed within this specification.
Figure 4B:
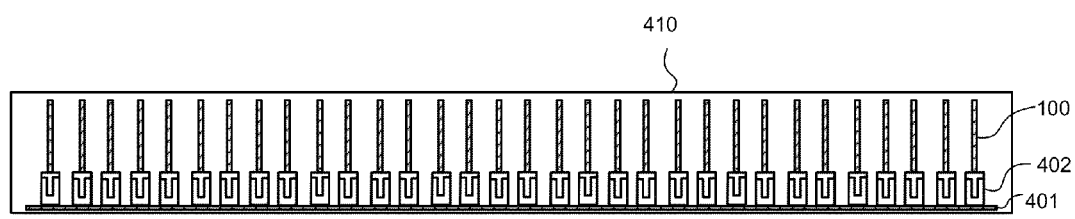
FIG. 4B is a mechanical diagram illustrating a cross-sectional view of the system of FIG. 4A in accordance with another embodiment disclosed within this specification.

FIGS. 4A and 4B are mechanical diagrams illustrating a system 400 in accordance with another embodiment disclosed within this specification. System 400 can include a first circuit board 401, a connector 403, a power supply 404, switches 440, and sockets 402 that are all attached to circuit board 401. In addition, system 400 includes a plurality of processor modules 100, with each processor module 100 disposed within one of sockets 402.

Power supply 404 is electrically connected, e.g., can be coupled to or mounted, to circuit board 401, to switches 440 and to sockets 402, and thus, to processor modules 100. Power supply 404 can be implemented as a plurality of independent power supplies. In one embodiment, power supply 404 can include a power supply for each of processor modules 100. In another embodiment, power supply 404 can include two or more independent power supplies for each processor module 100. For example, power supply 404 can include 96 power supply modules. Each of the 96 power supply modules can be dedicated for powering a particular one of processor modules 100. Each power supply module can include two power supplies powering different sockets 402, thereby providing power supply redundancy and failover. The individual power supplies of each power supply module, e.g., card, can be cross-coupled to different sockets 402 so as to allow individual power supply modules to be removed and reinserted without interrupting power to a particular processor module 100 that receives power from one of the power supplies on the power supply module being removed. For example, when one power supply module is removed, the processor module 100 that is powered by a power supply on the power supply module being removed can still be powered by a power supply on another power supply module that has not been removed and is, therefore, still operational. Module replacement, as it relates to power supply modules, storage modules, and/or processor modules, provides the advantage of solving reliability issues that are inherent in the requirements of enterprise class systems.

Connector 403 is electrically connected to each of sockets 402 through switches 440 for coupling each of sockets 402 to external systems. Connector 403 includes one or more connector receptacles for coupling system 400 with external circuitry. Though connector 403 is shown as a single connector, more than one connector 403 can be used. In an embodiment, connector 403 can include a plurality of ten gigabit Ethernet RJ-45 connector receptacles. In another embodiment, connector 403 can include SATA connectors, or any other type of connection that will allow for coupling of data to and from system 400.

Switches 440 can be coupled between individual sockets 402 and connector 403. Switches 440 allow for communication not only between each processor module 100 and external systems (coupled through connector 403), but also communication between individual processor modules 100. In an embodiment, switches 440 can be 10 gigabit Ethernet switches. Other types of switches, however, also can be used, e.g., PCIe.

FIGS. 4A and 4B illustrate the usage of a particular industry standard memory module interface mechanical standard, with both processor module 100 and socket 402 conforming to that particular standard. Accordingly, costs can be reduced as industry standard circuit boards, card-edge connectors and sockets are used.

In another embodiment, interface 170 can be a DIMM interface that includes a card-edge connector for coupling with external circuitry or systems. For example, circuit board 105 and interface 170 can conform to the JEDEC DDR2 DIMM interface mechanical standard, though circuit board 105 and interface 170 need not conform to the electrical requirements of the JEDEC DDR2 DIMM interface mechanical standard. For example, circuit board 105 can be a 133.35 mm by 69.84 mm printed circuit board. Programmable ICs 110 and 115, processors 120-126, RAMs 130-148, and power supplies 150-154 can be soldered to circuit board 105, with traces formed on printed circuit board 105 for electrically connecting the aforementioned components and the 240-pin card-edge connector of interface 170 together.

Though processor module 100 can be implemented to conform to the JEDEC DDR2 DIMM interface mechanical standard, as noted, processor module 100 need not conform to the JEDEC DDR2 DIMM pin out or electrical requirements. For example, each socket 402 can be a DIMM socket that conforms to the JEDEC DDR2 socket interface mechanical standard (e.g., the 240 pin DDRII SDRAM, 1.00 mm contact centers socket outline SO-001 B published in July, 2003). However, socket 402 does not conform to the JEDEC DDR2 DIMM socket pin-out or electrical requirements. More particularly, processor module 100 and socket 402 can have a custom pin-out. Further, processor module 100 can have a custom height.

In another embodiment, processor module 100, interface 170, and socket 402 can conform to other mechanical standards that allow for coupling card-edge connectors to a socket such that the circuit board can be easily removed. For example, processor module 100 can conform to the mechanical standards of the JEDEC DDR3 DIMM and socket 402 can conform to the 240 position DDR3 DIMM socket outline with 1.0 mm contact centers SO-007B (published in September of 2008). In another example, processor module 100 and socket 402 can conform to the JEDEC Mini-DIMM DDR2/DDR3 mechanical standard (e.g., socket 402 can conform to the 244 pin DDRII SDRAM, 0.60 mm lead centers socket outline SO-002B published in February, 2008), or the JEDEC FBDIMM DDR2/DDR3 mechanical standard (e.g., socket 402 can conform to the 240 position socket outline with 1.0 mm lead centers SO-003B published 08/06), or the JEDEC SO-DDR2 SDRAM mechanical standard, or the JEDEC SO-DDR3 SDRAM mechanical standard (e.g., socket 402 can conform to the 204 pin SO-DDR3 SDRAM socket outline with 0.6 mm contact centers SO-006B published in October of 2007). Still, as noted, processor module 100 and socket 402 can have a custom pin-out. Further, processor module 100 can have a custom height.

System 400 can be configured to fit within an enclosure 410. Enclosure 410 can be an industry standard 2U rack enclosure. For example, enclosure 410 can have a length of 26 inches, a width of 16.75 inches, and a height of 3.25 inches. Though system 400 is shown to include only one enclosure 410, in other embodiments system 400 can include a large number of enclosures 410 contained within one or more industry standard racks, with each enclosure 410 having some or all of the features of system 400 of FIGS. 4A-4B.

Referring to FIG. 4A, it can be seen that enclosure 410 can include a total of 96 processor modules 100. Thereby, system 400 provides a large amount of computational resources in a small amount of area (high-density). As illustrated in FIG. 4A, for example, each processor module 100 in system 400 provides 5 Gigabytes of RAM and 12 processor cores. Accordingly, system 400 provides approximately 480 Gigabytes of RAM and 1152 processor cores which can be achieved or provided in approximately one cubic foot of volume. In the case where octal core processors are used for processors 120-126, up to 3456 can be included in the same one cubit foot of volume.

The modular design of system 400 allows for processor modules 100 to be easily changed while using existing industry standard connections. Also, processor modules 100 can be organized in enclosure 410 and on circuit board 105 in such a way as to ensure a clear air flow through the enclosure 410. This allows for effective power dissipation from processor modules 100. Moreover, in an embodiment, system 400 can be configured so that a user can dynamically pull out and/or insert processor modules 100 while the power is on to change or replace processor modules 100 while system 400 remains operational. Within conventional server and/or storage systems, the addition or removal of processors requires that the server system be powered down to effectuate such architectural or structural changes to the server and/or storage system.

It should be appreciated that processor module 100 can be configured to include different sizes of RAMs and/or more or fewer RAMs than illustrated within this specification. In addition, some processor modules 100 in system 400 may include more RAM than other processor modules, with processor modules 100 easily being removed and replaced as new RAM becomes available. For example, each of RAMs 130-148 can be a 1 gigabyte DDR2 SDRAM, providing 10 gigabytes of RAM on each processor module 100.

This flexibility in the inherent design of processor module 100 provides strong capabilities for a number of differing applications based upon customer need. For example, each of programmable ICs 110 and 115 can be reconfigured to implement different physical circuit designs according to customer need. One or more different sets of configuration data, e.g., bitstreams, from configuration flash 160 can be loaded into one or both of programmable ICs 110 and 115 as needed and responsive to particular events. Similarly, program code used to operate any of the processors of processor module 100, whether implemented within programmable IC 110 and/or 115 or not, can be updated. As noted, program code can refer to operating systems, applications, and/or data. Thus, programmable ICs 110 and/or 115, as well as the various processors of each processor module 100 can be configured independently as needed. This capability allows each of processor modules 100 of system 400 to be configured independently and to be reprogrammed for differing applications within the same system.

As discussed, portions or selected regions of programmable IC 110 and/or programmable IC 115 can be reprogrammed, e.g., reconfigured, to implement different physical circuitry as specified by configuration data loaded therein, while the rest of programmable IC 110 and/or programmable IC 115 remains actively working or functional. The capability to reconfigure a portion of either one or both of programmable ICs 110 and/or 115 while other portions of the programmable IC being reconfigured to operate uninterrupted can be referred to as dynamic partial reconfiguration. This capability permits systems that employ processor modules 100 to have different modules configured for different purposes, perhaps at different times, in order to achieve a particular function.

Using dynamic partial reconfiguration, for example, a portion of a programmable IC can be configured to perform packet filtering. That same portion of the programmable IC can be reconfigured to implement different physical circuitry to perform an entirely different function while the other portions, e.g., the MPMCs, continue to function uninterrupted by the reconfiguration of the programmable IC. Thus, partial reconfiguration allows circuits, or portions thereof, to be dynamically replaced while processor module 100 is in operation. Reconfiguration and/or partial reconfiguration allows for temporal sharing of hardware resources to be applied to specific problems at specific times. Temporal sharing lowers cost and the power footprint of the system since less hardware is needed to implement a given number of functions than would be the case were reconfiguration and/or partial reconfiguration not be available. In this regard, when hardware is not configured or implemented, such hardware does not consume power, or consumes less power, thereby achieving lower power consumption and greater performance per cubic millimeter.

FIG. 4B illustrates a cross-sectional view of a system 400 of FIG. 4A taken along cut line 4B. FIG. 4B illustrates how processor modules 100 can be placed into sockets 402 to be substantially perpendicular to the top surface or plane of circuit board 401.

Figure 5A:
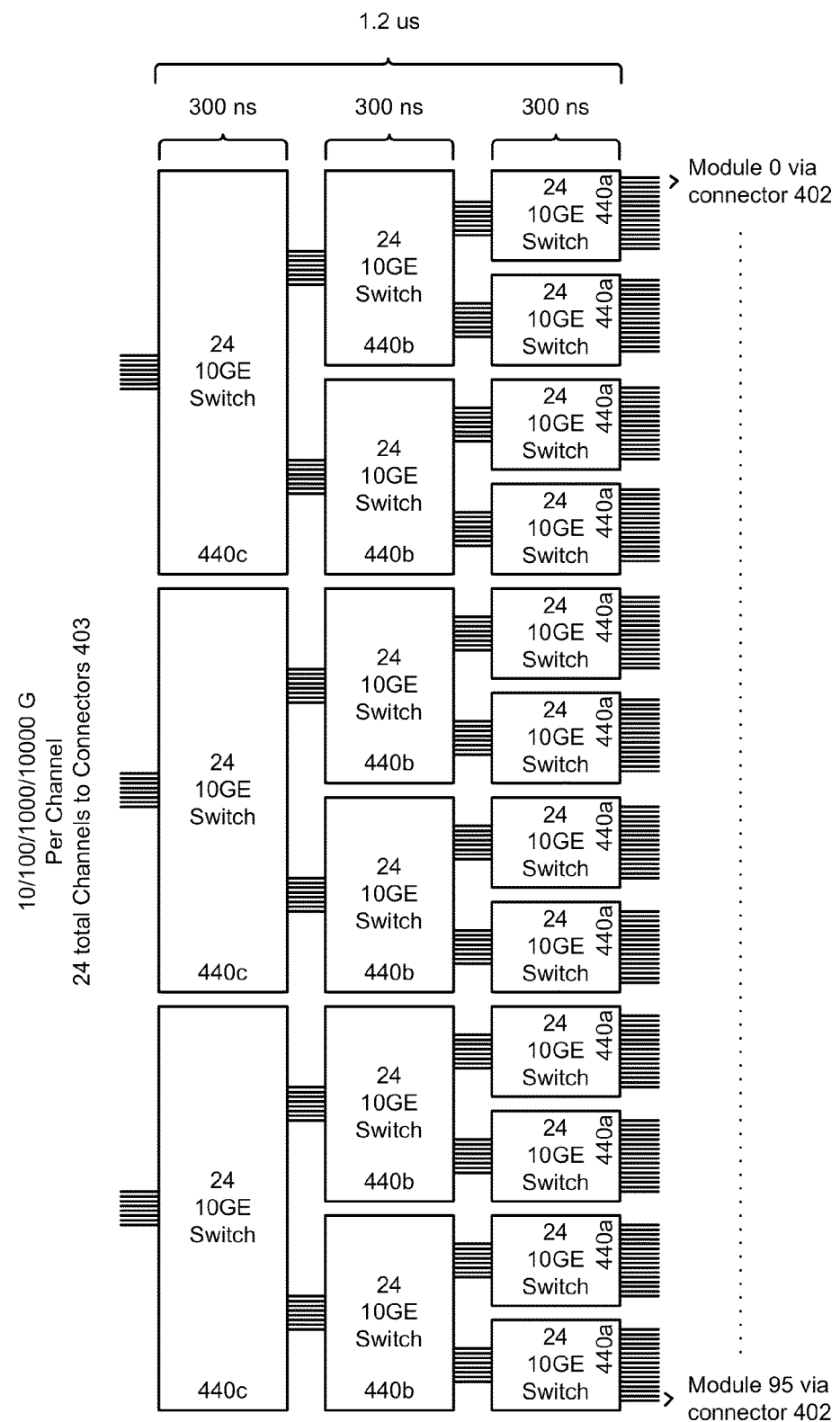
FIG. 5A is a block diagram illustrating connections within a system in accordance with another embodiment disclosed within this specification.

FIG. 5A is a block diagram illustrating connections within a system in accordance with another embodiment disclosed within this specification. More particularly, FIG. 5A illustrates an embodiment in which switches 440 include switches 440a, switches 440b, and switches 440c. Each of switches 440, i.e., switches 440a, 440b, and 440c, can be implemented as an intelligent 24-port ten gigabit Ethernet switch. Accordingly, each socket 402 can include 8 multi-gigabit transceivers organized as two channels of 10 gigabit Ethernet that are electrically coupled to an Ethernet switch 440a. Eight ports of each Ethernet switch 440a can be electrically connected to an Ethernet switch 440b, eight ports of each Ethernet switch 440b can be electrically connected to an Ethernet switch 440c, and eight ports of each Ethernet switch 440c can be electrically connected to eight ports of ten gigabit Ethernet on connector 403.

The connections between sockets 402, Ethernet switches 440a, 440b, 440c, and connector 403 can be electrical traces on circuit board 401. Thus, the Ethernet switch architecture shown in FIG. 5A provides 24 channels of ten gigabit Ethernet to connector 403 and 96 channels of 10 gigabit Ethernet to sockets 402 of FIG. 4 (one 10 gigabit Ethernet channel per socket 402). In other embodiments, various cross connections between switches 440 can be included to allow any processor module to communicate with virtually other processor module. Further, different switch topologies can be used that permit two 10 gigabit Ethernet connections per socket 402.

In an embodiment, each of switches 440 can be configured to intelligently route data according to various factors including, but not limited to, header information, footer information, and payload or content of each respective packet. In one embodiment, switches 440 can be configured to route data according to an Internet Protocol (IP) address specified in the data. The IP address can be correlated with a particular processor module or a particular processor of a processor module. Routing tables can be stored within switches 440 to determine how to route received data according to the IP address specified therein.

In another embodiment, data can be routed according to content of the payload as opposed to header and/or footer information. For example, routing tables can be established for routing data according to content of the data as determined by deep packet inspection. It should be appreciated, however, that data can be routed among switches 440 according to IP address, deep packet inspection (e.g., content or payload), or a combination of both. Switches 440 further can be configured to broadcast data or re-broadcast data based upon the routing table rules established. One exemplary implementation of a switch 440 can be one of the FM 6000 series of ICs such as the FM6264, which is available from Fulcrom Microsystems of Calabasas, Calif.

In the example described with reference to FIG. 5A, ten gigabit Ethernet is used as a backbone to connect circuits and/or systems external to system 400 through 24 ports of ten gigabit Ethernet to the 96 ports of 10 gigabit Ethernet on the 96 processor modules. This allows multiple users to concurrently access the processors on the processor modules, allowing for concurrent and independent processing of data, searching, and/or servicing of requests. It should be understood that FIG. 5A is one example of a switch architecture and that different switch architectures can be used in accordance with the one or more embodiments disclosed within this specification.

In another embodiment, one or more channels of 10 gigabit Ethernet can be used to couple adjacent ones of switches 440c, adjacent ones of switches 440b, adjacent ones of switches 440c, or any combination thereof. For example, rather than utilizing all available channels of 10 gigabit Ethernet to couple a first switch 440c to a particular one of switches 440b, a first of the available channels of 10 gigabit Ethernet used to couple the first switch 440c to the particular one of switches 440b can be used to couple the first switch 440c to a second adjacent switch 440c. A second channel of available 10 gigabit Ethernet used to couple the first switch 440c to the particular switch 440b can be used to couple the first switch 440c to a second adjacent switch 440c.

Similarly, rather than utilizing all available channels of 10 gigabit Ethernet to couple a first switch 440b to a particular one of switches 440a, a first of the available channels of 10 gigabit Ethernet used to couple the first switch 440b to the particular one of switches 440a can be used to couple the first switch 440b to a second adjacent switch 440b. A second channel of available 10 gigabit Ethernet used to couple the first switch 440b to the particular switch 440a can be used to couple the first switch 440b to a second adjacent switch 440a.

Likewise, a first of the available channels of 10 gigabit Ethernet used to couple a first switch 440a to connector 402 can be used to couple the first switch 440a to a second adjacent switch 440a. A second channel of available 10 gigabit Ethernet used to couple the first switch 440a to connector 402 can be used to couple the first switch 440a to a second adjacent switch 440a. It should be appreciated that connectivity to socket 402 is limited only by the number of ports available on connector 170 and pins available on socket 402.

Figure 5B:
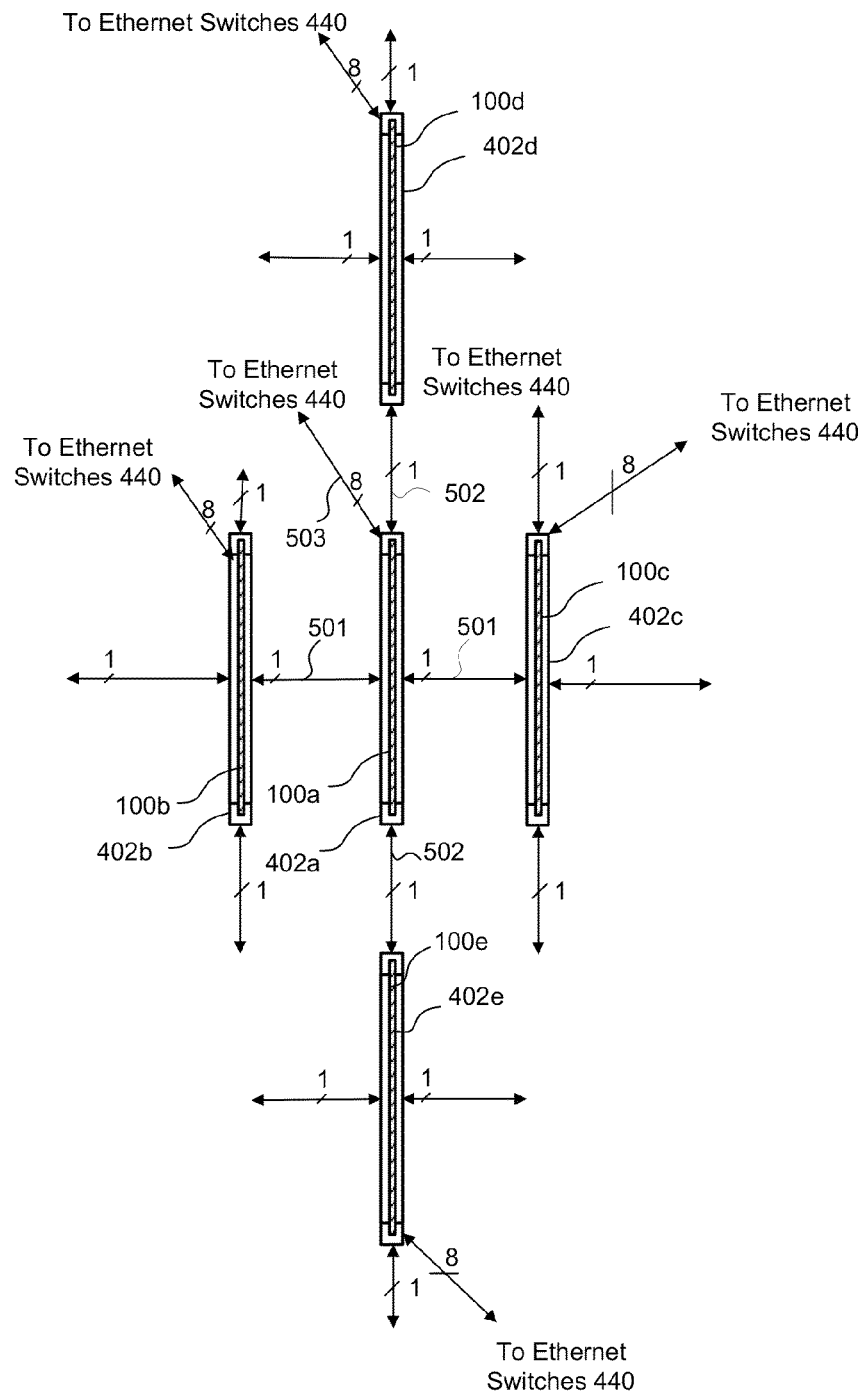
FIG. 5B is an electro-mechanical diagram illustrating connections between receptacles of a system in accordance with another embodiment disclosed within this specification.

FIG. 5B is an electro-mechanical diagram illustrating connections between receptacles of a computing system in accordance with another embodiment disclosed within this specification. More particularly, FIG. 5B illustrates exemplary connections between a receptacle 402a and adjacent receptacles 402b-402e within system 400. Within FIG. 5B, for example, each of receptacles 402 can include approximately 12 channels of gigabit Ethernet. In this regard, each receptacle 402 can be directly connected to horizontally adjacent receptacles by one channel of gigabit Ethernet and can be directly connected to vertically adjacent receptacles by one channel of gigabit Ethernet. The remaining eight channels of gigabit Ethernet can be coupled to switch 440. Still, as noted, the particular communication protocol used is not intended to be limited to Ethernet or a particular type of Ethernet. As noted, for example, PCIe can be used.

As shown, one channel of gigabit Ethernet 501 can couple to each of the processor modules 100b-100c that are adjacent to processor module 100a horizontally and one channel 502 of gigabit Ethernet can couple to each of processor modules 100d-100e that are adjacent to processor module 100a vertically. For example, socket 402a can connect directly via metal traces on circuit board 401 to sockets 402b, 402c, 402d and 402e. Accordingly, in an embodiment, eight channels of gigabit Ethernet can be coupled to Ethernet switches 440 as shown by line 503. Some or all of sockets 402, as shown in FIGS. 4A and 4B, can be coupled in the same manner. The embodiment described permits the eight channels of gigabit Ethernet to switch 440 to be configured as two channels of 10 gigabit Ethernet.

In an embodiment, the multi-gigabit transceivers of programmable ICs 110 and/or 115 can be operable to control communication over channels 501-502. Accordingly, channels 501-502 only need to include conductive traces that extend between respective sockets 402a-402e and do not need any other type of switch or other device on circuit board 401 to implement gigabit Ethernet channels 501-502. Again, other types of communication protocols, e.g., high speed serial protocols, can be used such as, for example, PCIe, Aurora as developed by Xilinx®, or the like.

Figure 6:
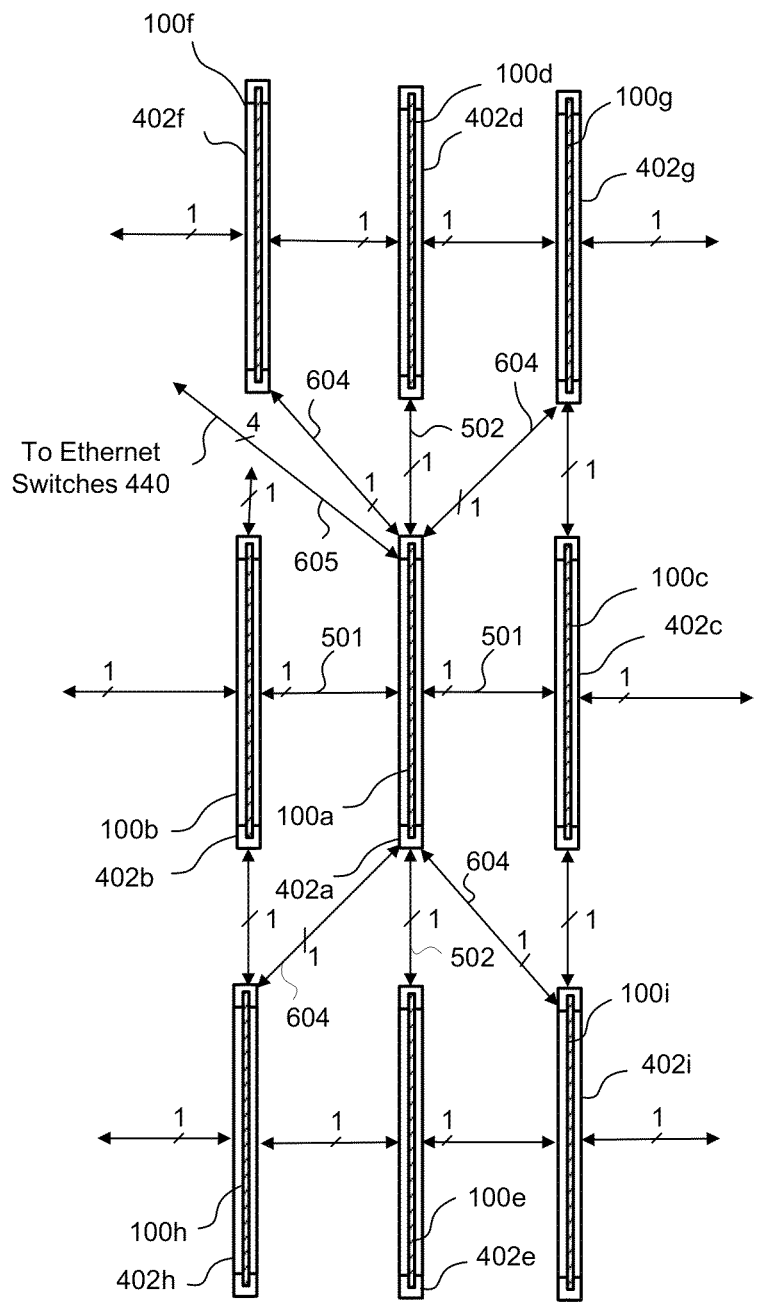
FIG. 6 is an electro-mechanical mechanical diagram illustrating connections between receptacles of a system in accordance with another embodiment disclosed within this specification.

FIG. 6 is an electro-mechanical diagram illustrating connections between receptacles of system 400 in accordance with another embodiment disclosed within this specification. FIG. 6 shows an architecture in which, in addition to coupling to horizontally and vertically adjacent sockets 402 in the manner shown in FIG. 5B, processor module 100a couples diagonally to each processor module 100f-100i that is adjacent to processor module 100a diagonally. More particularly, one channel of gigabit Ethernet 604 connects, via metal traces on circuit board 401, directly to each of sockets 402f-402i. In this embodiment, four channels of gigabit Ethernet 605 are coupled to Ethernet switches 440, or one channel of 10 gigabit Ethernet. In one or more embodiments, some or all of the sockets 402 illustrated in FIGS. 4A-4B are coupled in the same manner as socket 402a of FIG. 6.

Figure 7:
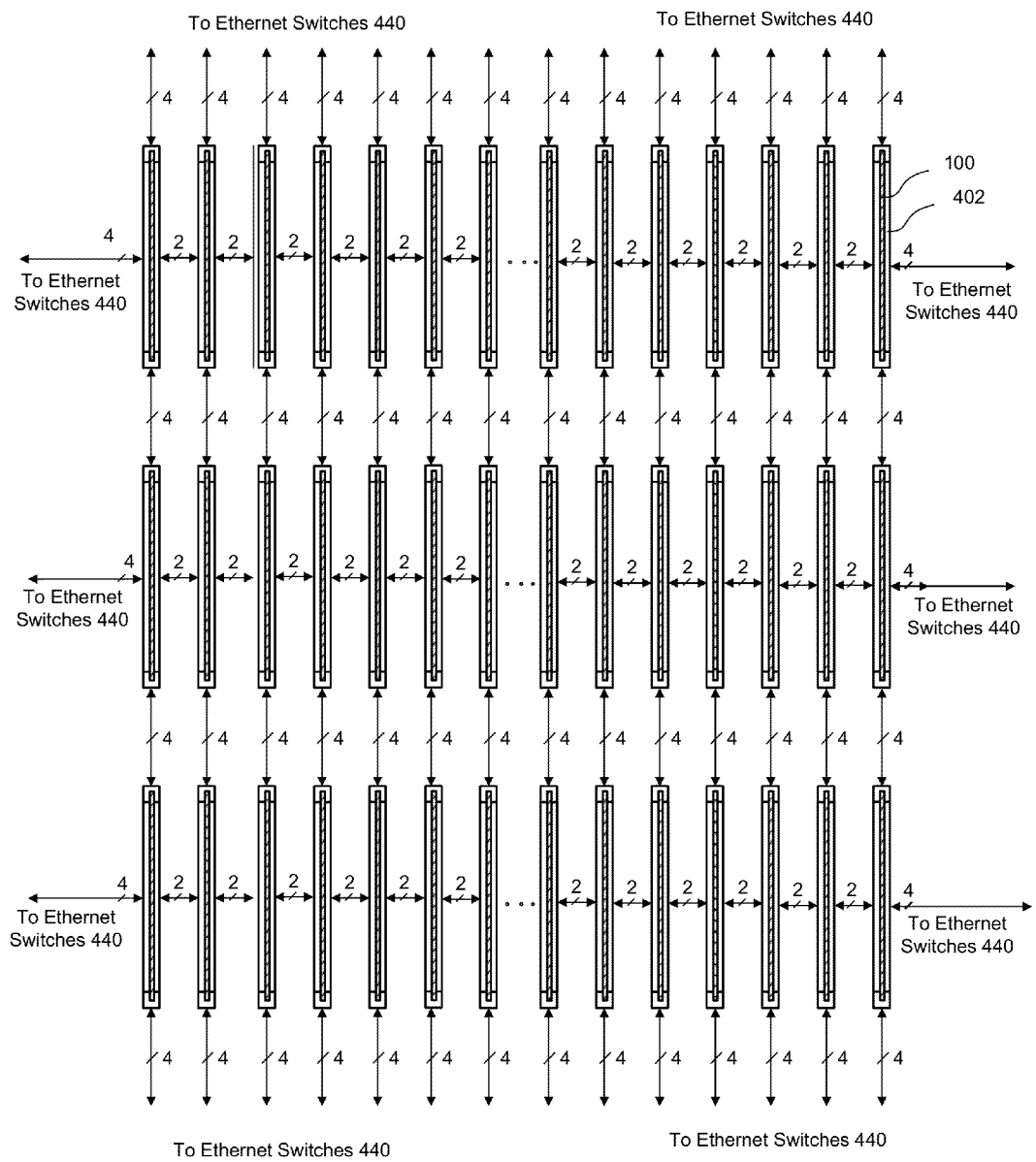
FIG. 7 is an electro-mechanical diagram illustrating connections between receptacles of a system in accordance with another embodiment disclosed within this specification.

FIG. 7 is an electro-mechanical diagram illustrating connections between receptacles of system 400 in accordance with another embodiment disclosed within this specification. As pictured in FIG. 7, each socket 402 is directly connected to horizontally adjacent receptacles 402 by four channels of gigabit Ethernet and is directly connected to vertically adjacent receptacles 402 by four channels of gigabit Ethernet (or one 10 gigabit Ethernet channel), with sockets 402 on the edges of the pattern coupling to switches 440. Traces on circuit board 401 can couple sockets 402 together to achieve the desired structure. Each socket on the top row can couple four channels of gigabit Ethernet or one channel of 10 gigabit Ethernet to switches 440 and each socket on the bottom row can couple four channels of gigabit Ethernet to switches 440, with receptacles on the outside rows coupling four channels of gigabit Ethernet or one channel of 10 gigabit Ethernet to switches 440.

Though the one or more embodiments illustrated in FIGS. 5B-7 show communication between adjoining memory modules 100 using gigabit Ethernet channels, communication between memory modules can also be provided by using dedicated I/O connections. More particularly, in an embodiment, I/O pins of adjoining sockets 402 can be connected together in the same manner as shown in FIG. 5B, freeing up all twelve gigabit Ethernet channels to be coupled to connector 403 and/or switches 440. Similarly, by using dedicated I/O connections and the architecture of FIG. 5B, the number of gigabit Ethernet channels coupled to connector 403 can be increased to eight (or two channels of 10 gigabit Ethernet). As noted, other types of communication protocols can be used, e.g., high speed serial interfaces, individual I/Os, as well as various single or double data rate techniques typically used to communicate with RAM devices can be used in lieu of Ethernet.

FIGS. 4-7 are provided to illustrate various exemplary embodiments. FIGS. 4-7 illustrate the flexibility provided by computing systems configured as described. The examples presented, however, are not intended to be limiting of the one or more embodiments disclosed within this specification. For example, system 400 can be designed such that the interconnections between processor modules 100 and switches 440 are tailored to meet the needs of the particular application. Thus, the particular topologies shown involving sockets 402 in FIGS. 5B-7 are not intended to be limiting. Any of a variety of different topologies can be used.

Moreover, though the structures of FIGS. 4-7 illustrate the use of switches 440 that are Ethernet switches, it should be appreciated that other types of switches and connection mechanisms can be used in lieu of, or in addition to, those described. For example, other types of switches and other types of communication protocols can be used for communication between processor modules 100 and for communication between individual processor modules 100 and external devices. In one example, the Aurora Protocol from Xilinx® can be used for communication between individual processor modules 100 and/or between processor modules 100 and external devices. In another example, SATA, Serial Attached SCSI (SAS), PCIe, or other known communication methodologies and physical devices can be used.

Figure 8A:
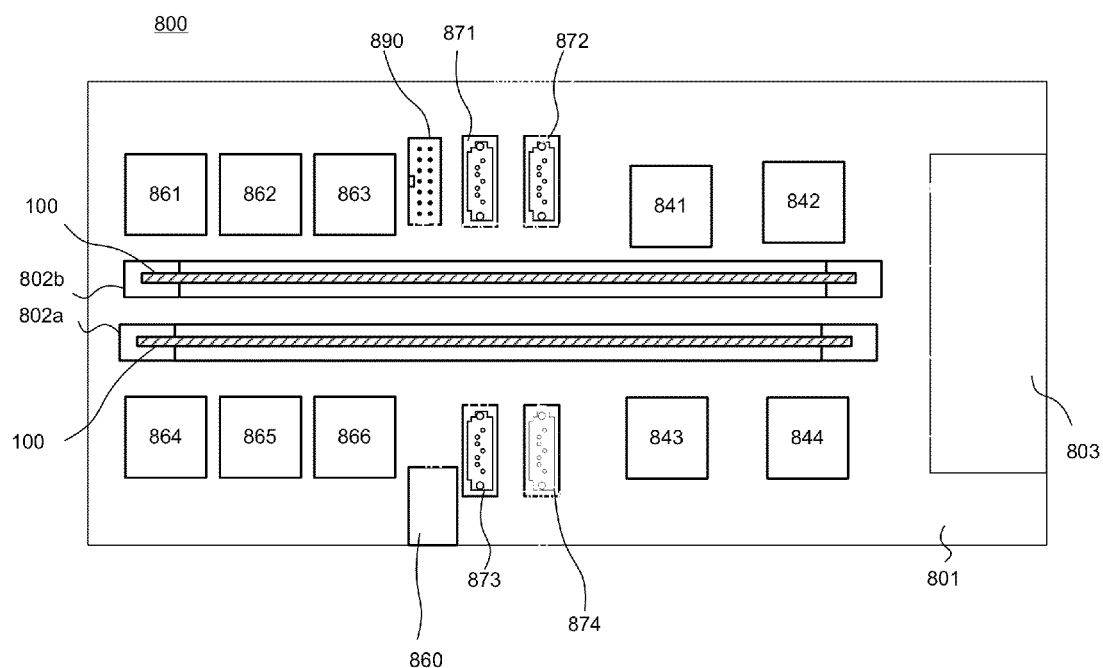
FIGS. 8A and 8B are mechanical diagrams illustrating a system in accordance with another embodiment disclosed within this specification.
Figure 8B:
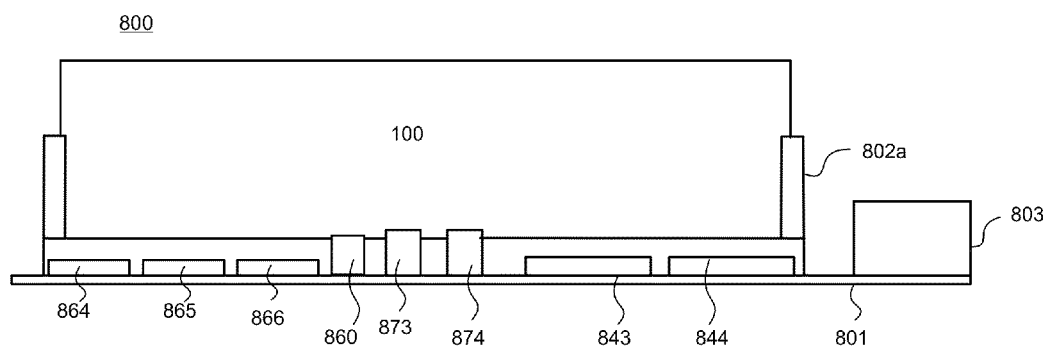

FIGS. 8A and 8B are mechanical diagrams illustrating a system 800 in accordance with one or more embodiments disclosed within this specification. System 800 can utilize SATA connectors 871-874, gigabit Ethernet PHYs 841-844, gigabit Ethernet connector 803, and sockets 802a-802b that are coupled (e.g., soldered) to a circuit board 801. System 800 also can include power supply IC devices 861-866 that can be electrically connected to a power input connector 860 for powering processor modules 100 and the other components of system 800. Circuit board 801 can be a 26.28 cm. by 12.66 cm. printed circuit board. In another embodiment, system 800 can be larger and can employ a larger number of receptacles 802a-802b and processor modules 100.

Figure 9:
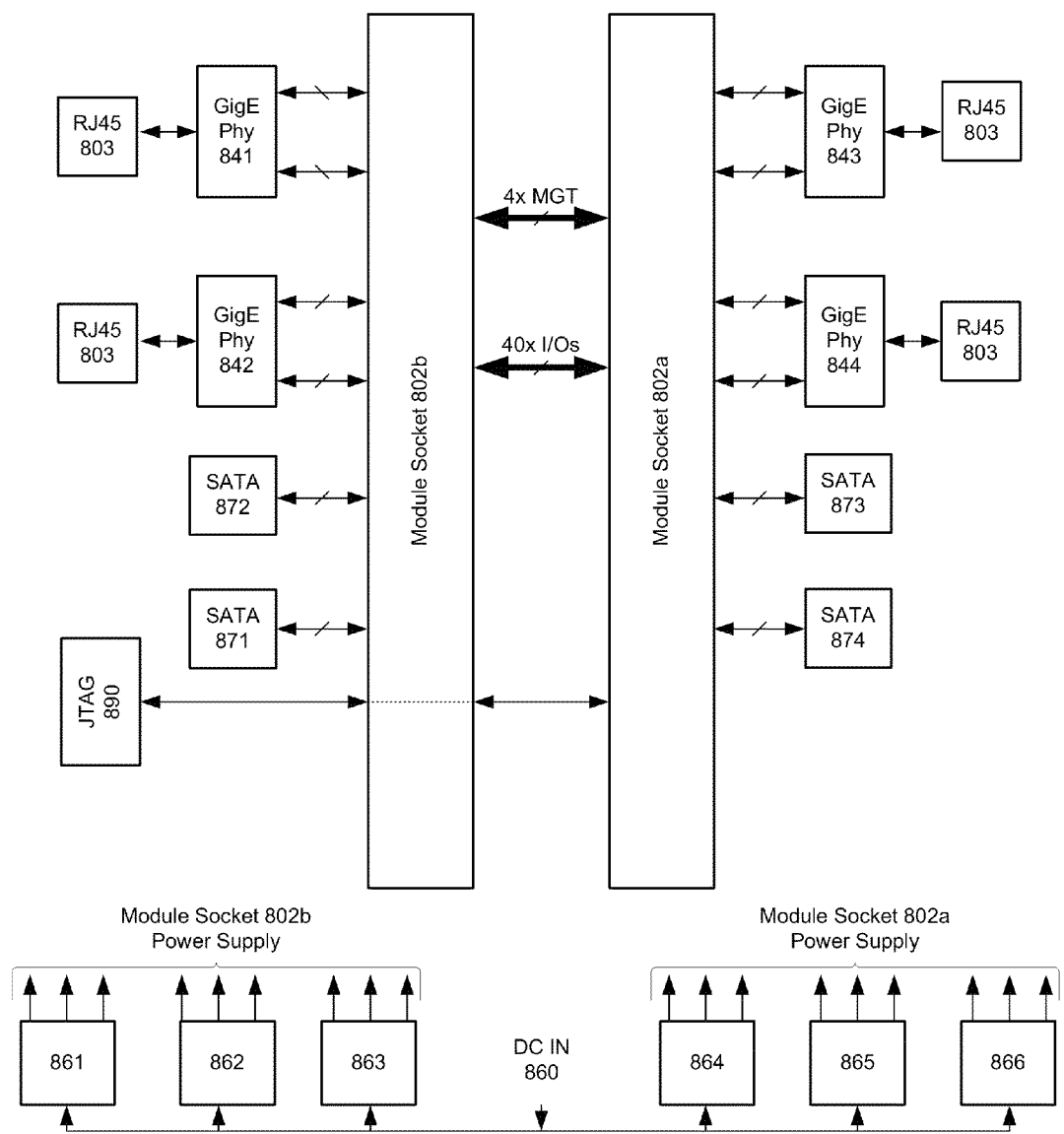
FIG. 9 is a block diagram illustrating the system of FIG. 8 in accordance with another embodiment disclosed within this specification.

FIG. 9 is a block diagram illustrating system 800 of FIG. 8 in accordance with another embodiment disclosed within this specification. FIG. 9 illustrates the connections of sockets 802a and 802b to gigabit Ethernet PHYs 841-844. In an embodiment, Ethernet PHYs 841-844 can be 1 gigabit Ethernet physical interface chips that are electrically connected to connector 803 which can be, for example, a Gigabit Ethernet RJ-45 Halo Fastjack having four receptacles. More particularly, socket 802a can be electrically connected to gigabit Ethernet PHYs 843-844, which can be electrically connected to connector 803.

Similarly, socket 802b can be electrically connected to gigabit Ethernet PHYs 841-842, which can be electrically connected to connector 803. Communication between socket 802a and 802b is provided by either of four multi-gigabit channels (4×MGTs 201) and/or 40 I/O lines (40×IOBs 204) that extend between sockets 802a and 802b. JTAG port 890 can electrically connect to both socket 802a and socket 802b such that JTAG port 890 can be shared between processor modules 100 in sockets 802a-802b. SATA connectors 871 and 872 can electrically connect to socket 802b and SATA connectors 873-874 can electrically connect to socket 802a.

Figure 10:
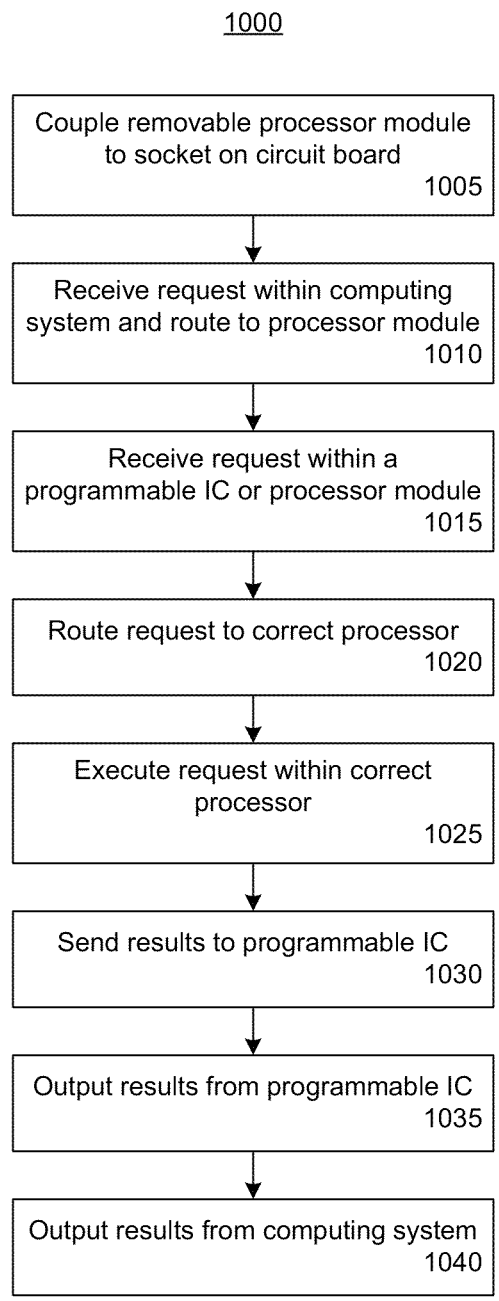
FIG. 10 is a flow chart illustrating an exemplary method of processing requests in accordance with another embodiment disclosed within this specification.

FIG. 10 is a flow chart illustrating an exemplary method 1000 of processing requests in accordance with another embodiment disclosed within this specification. Method 1000 can be implemented using a system such as system 400 described with reference to FIGS. 4A and 4B, or system 800 described with reference to FIGS. 8A and 8B, for example. Method 1000 can begin in a state where the system is powered on and, thus, is operational or not.

As shown in step 1005 a removable processor module as described within this specification can be coupled to a socket on a circuit board. As discussed, the removable processor module can include RAM, a plurality of processors, and one or more programmable ICs having configurable circuitry. For example, step 1005 can be performed by inserting a processor module 100 into a socket 402 as described and illustrated with reference to FIGS. 4A and 4B or with reference to socket 802 as described with reference to FIGS. 8A and 8B.

In step 1010, a request can be received within the system. The request can be routed to a particular processor module. The request can be directed through the computing system to a suitable processor module and a suitable processor within the processor module. The request, for example, can be routed through connector 403, through switches 440, e.g., through switches 440c, 440b, and 440a, to a particular connector 402 that holds a particular processor module 100. The request is provided from connector 402 to the processor module via connector 170 of the particular processor module 100. In an embodiment, the request can be simultaneously, or nearly simultaneously, broadcast via one or more of the Ethernet channels that couple to pins of one or more multi-gigabit transceivers of programmable ICs 110 and/or 115 of each processor module 100 in system 400 and/or 800. As noted, each request can be directed to a particular IP address. Each processor (e.g., processors 120-126, 318, 320, 342, and 344 of processor module 100) can have a unique IP address. Requests also can be routed using deep packet inspection or a combination of deep packet inspection and IP addressing.

In step 1015, the request can be received within in a programmable IC of the processor module. As noted, each request can be directed to a particular IP address. Each processor (e.g., processors 120-126, 318, 320, 342, and 344 of processor module 100) can have a unique IP address. Thus, the request can be provided via interface 170 to a particular one of the programmable ICs of the processor module via an HSS interface of the intended programmable IC based upon the particular IP address or other factor, e.g., deep packet inspection, to which the request is directed and the particular processors included within, or serviced by, each respective programmable IC.

In step 1020, the programmable IC can route the received request to the processor, e.g., the correct or intended processor, disposed on the same processor module based upon the IP address or other factor specified by the request. In illustration, within the programmable IC, an offload engine can process the request. The offload engine, for example, can maintain a mapping of logical addresses of processors to IP addresses that correspond to, or are associated with, each processor of the processor module. The offload engine can store data from the request or the entire request itself in an appropriate RAM via an MPMC. The offload engine then can generate an interrupt to the particular processor of the processor module indicated by the IP address.

It should be appreciated that in some cases, e.g., when programmable IC 110 receives a request that is directed to a processor coupled to programmable IC 115, programmable IC 110 can pass or forward the request to programmable IC 115 for further processing, e.g., routing to the correct processor.

In step 1025, the processor, having received the request, e.g., the interrupt, can execute the request. In executing the request, the processor can access one or more of the RAMs available on the processor module including the particular RAM within which the data associated with the request is stored. For example, data can be read from RAMs, written to RAMs, and further processed within the processor. One or more additional functions can be offloaded from the processor to various circuit blocks within the programmable IC, e.g., to DSP units or the like.

In step 1030, the processor can send the results of execution of the request to the programmable IC. Results, for example, can be communicated through an FSB of the programmable IC. In step 1035, the programmable IC, responsive to receiving results from the processor, can output the results. Results, for example, can be output via the offload engine through an output port, e.g., an HSS interface, to connector 170. In step 1040, the results can be output from the computing system. More particularly, the results can be output from the processor module, e.g., via connector 402, through switches 440a, 440b, and 440c, to connector 403 and out to the source of the request, which can be a system external to processor module 100 and system 400 and/or 800.

Although the steps of FIG. 10 are described with reference to a single processor module executing the request, it should be appreciated that, alternatively, operations can be performed in an integrated manner between programmable ICs on different processor modules. For example, one programmable IC 110 can request that one or more operations be performed by a processor located within a different processor module 100 allowing tasks to be shared between the processing features of different processor modules 100.

In an embodiment, the techniques and apparatus disclosed within this specification can be incorporated into a highly scalable array of computing systems, e.g., combined with an array of personal computing systems, an array of enterprise class storage and computing systems (e.g., servers), or a mixture of both personal and enterprise computing systems, tied together to form a "network." In another embodiment, the array of computing systems can be formed entirely by apparatus as disclosed within this specification, e.g., using multiple ones of systems 400 and/or 800 in lieu of conventional personal and/or enterprise computing systems. In either case, the configurations noted provide an immense amount of computational horsepower that can be used for exacomputing applications.

In another embodiment, some processor modules of the system can be dynamically programmed for different applications and perform different roles. For example, one or more of the processor modules can be used for data storage while one or more other processor modules can be configured and used to perform computations. In another example, the computational elements can be temporally shared such that at different times each processor module 100 does a different computation on the prior data. The data, for example, can remain resident within a particular processor module 100. The data can remain resident, for example, while one or both of programmable ICs 110 and/or 115 undergo partial reconfiguration to effectuate the different application specific system within processor module 100, e.g., one of a storage node or a processor node.

In another aspect, partial configuration of the programmable ICs can facilitate pipelining by allowing the data to remain in place and continually implementing new pipeline stages, e.g., circuits, surrounding the data. More particularly, rather than routing or moving data to further pipeline stages to effectuate multi-stage, pipelined processing, the data can remain in place while the circuitry that is to operate on the data is dynamically and partially reconfigured to change. This effectively changes the pipelined stage that is implemented around the data. In situations where the amount of data being processed is large, leaving the data in place and changing the pipeline stage around the data can result in a significant reduction in the cost per operation performed.

Accordingly, the processor modules described have the ability to dynamically shift from a storage system to a computational system. Some of the advantages of configuration and/or reconfiguration of the programmable ICs include the ability for a particular processor module 100 to issue a request to a different processor module 100. Thereby, transactions can be propagated through system 400 in any way that meets the needs of the particular application. This ability to reconfigure programmable ICs, the functionality of the processor modules, and reprogram processors of the processor modules can be leveraged for purposes of fault tolerance and load sharing. In effect, within the larger system, the system can be dynamically reconfigured to change one or more of computing functionality, networking functionality, e.g., routing of data among processors and/or programmable ICs, and storage of the system over time during operation.

In illustration, consider the case in which one or more of the processor modules are included in system 400 or system 800 that have an architecture that includes additional flash modules that can be used for long term storage of data. Such processor modules can have fewer processors, fewer programmable ICs, fewer RAMs, etc., than described with reference to processor module 100 described within this specification. Such processor modules with flash storage, as well as processor modules 100, can function cooperatively wherein processor modules with flash storage function as disk-based storage and processor modules with less flash function as described. Further, because of the dynamic ability to implement different circuit architectures within the programmable ICs and the ability to reboot processors with different operating system and/or application program code, a processor module can be switched dynamically to function as a processor module or a storage module according to need during operation of the larger system, e.g., system 400 or 800.

In another embodiment, a disk operating system can be stored in one or more of the processor modules and can execute on any of the various processors disposed therein. This provides the ability to run a disk operating system directly on one or more processor modules. Accordingly, an outside system that makes a request to a particular processor module can be relieved of a relatively difficult task. Aspects of the task, e.g., sub-tasks, can be offloaded to other processor modules within system 400 or system 800. The offloading of tasks or sub-tasks can result in parallel execution across multiple processor modules using the broadcast mechanism previously discussed, e.g., through switches 440.

In some cases, the distribution of tasks across processor modules can slightly increase the load to each processor. In the case, for example, where one or more of the processor modules are configured for data storage, only the particular processor module that is storing the file in question, e.g., the requested file, needs do any further work such as sending the requested file.

In another example, when the search request does not require action by a particular processor module (e.g., the request only involves data saved on other processor modules) a particular processor module can simply ignore the search request, allowing it to continue performing other tasks. Also, the processor module that contains the data to be searched now has the ability to manage the storage of the data in a means which is best for the implementation.

Figure 11:
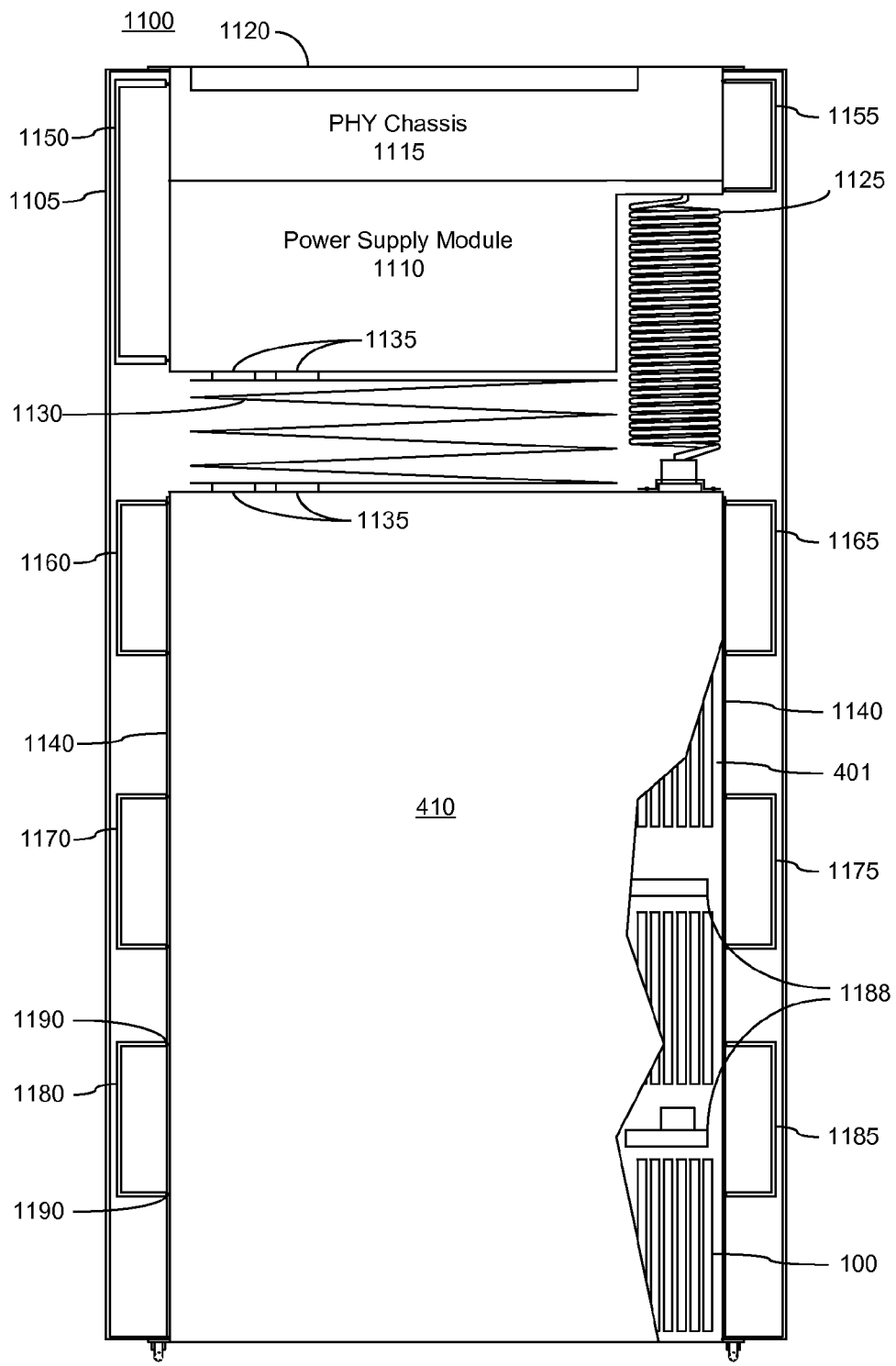
FIG. 11 is a mechanical diagram illustrating an cut-away, overhead view of a system in accordance with another embodiment disclosed within this specification.

FIG. 11 is a mechanical diagram illustrating a cut-away, overhead view of a system 1100 in accordance with another embodiment disclosed within this specification. System 1100 can be used to house one or more instances of system 400, for example, as described with reference to FIGS. 4-7 within this specification. As shown, system 1100 can include an outer case 1105 capable of holding multiple standard 2U rack units thereby being capable of holding multiple instances of enclosure 410 and thus, system 400, for example.

Outer case 1105 can include a power supply module 1110 configured to convert NC power to DC power and a PHY chassis 1115 that can be part of the back plane of system 1100. As shown PHY chassis 1115 can include a plurality of connectors 1120 for coupling to external circuitry. Power supply module 1110 can be coupled to enclosure 410 through a connecting cable 1125. In one or more embodiments, connecting cable 1125 can be a coiled cable that allows enclosure 410 to be pulled out of system 1100 via sliding rails 1140 on each side of enclosure 410, thereby providing access to the various processor modules 100 coupled thereto.

Enclosure 410 can be coupled to computing system 1100, e.g., to the PHY chassis 1115 through a high speed multi-plane and multi-lane flexible PCB 1130. Flexible PCB 1130 can, for example, carry data signals between system 400 within enclosure 410 to the backplane PHY chassis 1115 of computing system 1100. As shown, at each end of flexible PCB 1130, one or more connectors 1135 can be used to couple flexible PCB 1130 to circuitry that couples to PHY chassis 1115 and to circuitry coupling to circuit board 401 of system 400 within enclosure 410.

Within outer case 1105, system 1100 can include a plurality of plenums configured to channel cool or conditioned air into selected areas within outer case 1105. As shown, system 1100 can include plenums 1150-1185 configured to channel conditioned air from one or more distribution sources. Each plenum can traverse the case vertically along the various individual instances of enclosures 410. Each of plenums 1150-1185 further can include openings through which air can flow into various areas of outer case 1105 and, for example, into different instances of enclosure 410, as will be described in greater detail within this specification.

Plenums 1150 and 1155 can be supply conditioned air to PHY chassis 1115 and/or to power supply module 1110. Plenums 1160 and 1165 can supply conditioned air to the power supplies within each of enclosures 410 of computing system 1100. Plenums 1170-1185 can supply conditioned air to each of computing systems 400. Each of plenums 1150-1185 can couple to the various individual enclosures 410 using rubber seals 1190 to reduce and/or eliminate leakage of conditioned air. A plurality of fans 1188 mounted on each circuit board 401 within each of enclosures 410 can facilitate air flow and cooling for each of computing systems 400 included in computing system 1100.

In an embodiment, each of plenums 1150-1155 can be configured to direct airflow into power supply module 1110. Similarly, each of plenums 1160-1185 can be configured to direct airflow into enclosures 410. In that case, for example, airflow can exit a port on power supply module 1110 and exit a port on enclosure 410, e.g., out a front of enclosure 410 (the bottom of enclosure 410).

In another embodiment, airflow can be directed into power supply module 1110 via plenum 1150 and exit power supply module 1110 via plenum 1155. Similarly, airflow can be directed into enclosure 410 via plenums 1160, 1170, and 1180 and can exit enclosure 410 through plenums 1165, 1175, and 1185. In this manner, airflow can be directed across enclosure 410.

In any case, it should be appreciated that the direction of airflow in each of plenums 1150-1185 can be configured as desired since each can be implemented independently and can have an independent airflow source. Further, directionality of airflow within each of plenums 1150-1185 can be reversed (e.g., to function as an intake or an exhaust) to effectuate the type of airflow desired.

Figure 12:
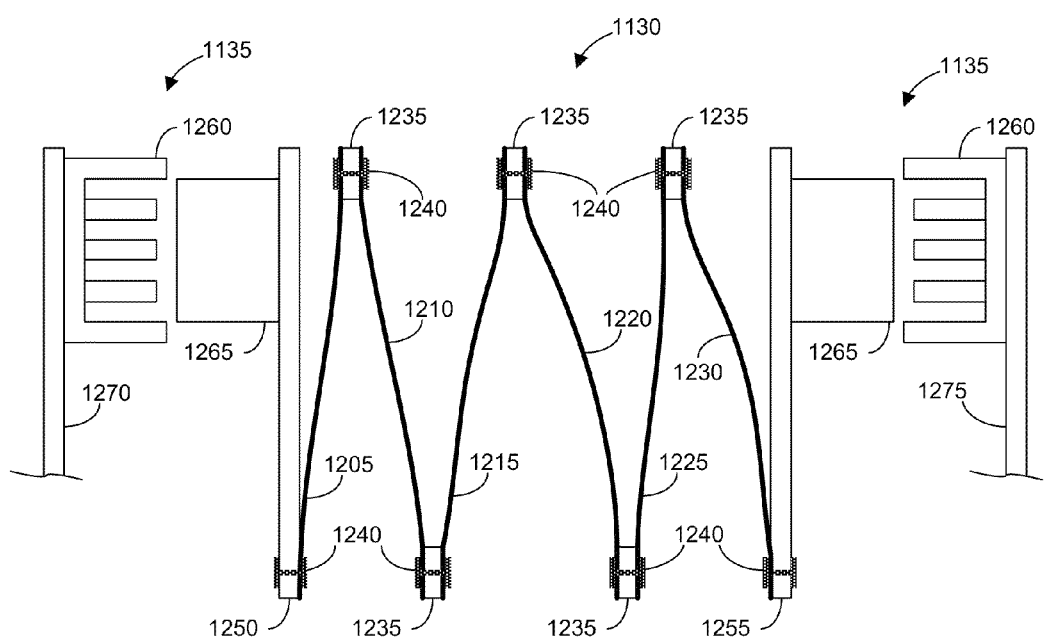
FIG. 12 is a schematic diagram illustrating a flexible printed circuit board in accordance with another embodiment disclosed within this specification.

FIG. 12 is a schematic diagram illustrating a flexible PCB in accordance with one or more embodiments disclosed within this specification. FIG. 12 illustrates an exemplary implementation of flexible PCB 1130 described with reference to FIG. 11. It should be appreciated that FIG. 12 is presented for purposes of illustration only and is not intended as a limitation of the one or more embodiments described within this specification. For example, in another embodiment, flexible PCB 1130 can be implemented as a single, longer ribbon style flexible PCB as opposed to using a plurality of flexible PCBs coupled as shown.

Continuing with FIG. 12, flexible PCB 1130 can be formed of a plurality of individual flexible PCBs 1205, 1210, 1215, 1220, 1225, and 1230. Pairs of flexible PCBs 1205 and 1210, 1210 and 1215, 1215 and 1220, 1220 and 1225, and 1225 and 1230 can be coupled together using circuit board interposers 1235 to form a "z-type" of connector design that facilitates flexibility of flexible PCB 1130 as a whole and extension of PCB 1130 to a length that allows enclosure 410 to be pulled out of, or substantially out of, case 1105 on rails 1140 without electrically disconnecting enclosure 410 from case 1105. Circuit board interposers 1235 can be configured to couple to flexible PCBs on each side to facilitate transference of signals carried through the two flexible PCBs being joined by each of interposers 1235. At each end of flexible PCB 1130, the last lengths of flexible PCB, i.e., flexible PCBs 1205 and 1230, can couple to rigid circuit boards 1250 and 1255 respectively.

In one or more embodiments, mechanical strain relievers 1240 can be attached to each end of each of flexible PCBs 1205-1230 to ensure that tension on flexible PCB 1130 does not cause one of the individual flexible PCBs 1205-1230 to become decoupled from circuit board interposers 1235 or circuit boards 1250 and 1255. For example, mechanical strain relievers 1240 can be bands or clamps that apply a minimum amount of pressure or force thereby mechanically pressing each flexible PCB to the interposer 1235 around which strain relievers 1240 are clamped or banded. Strain relievers 1240 can prevent an end of one of flexible PCBs 1205-1230 from becoming decoupled, whether mechanically or electrically, from either circuit board interposer 1235 or circuit boards 1250 and 1255.

As shown, connectors 1135 from FIG. 1100 are separated into their constituent parts. For example, each of connectors 1135 is illustrated as including a male portion 1260 and a female portion 1265. Female portion 1265 can receive male portion 1260 to form a mechanical coupling and electrical connections. One female portion 1265 is coupled to circuit board 1250 and another female portion 1265 is coupled to circuit board 1255. One male portion 1260 is coupled to circuit board 1270 and another male portion 1260 can be coupled to circuit board 1275. Circuit board 1270 can be mounted or otherwise attached to an interior surface or mounting bracket of case 1105. Within FIG. 1100, for example, circuit board 1270 can be coupled to a structural element of case 1100 that is proximate or surrounds power supply module 1110. Circuit board 1275 can be mounted or otherwise attached to enclosure 410. Connectors 1135, e.g., male portion 1260 and female portion 1265, can include mechanical locking mechanism to ensure proper electrical connection at all times.

Figure 13A:
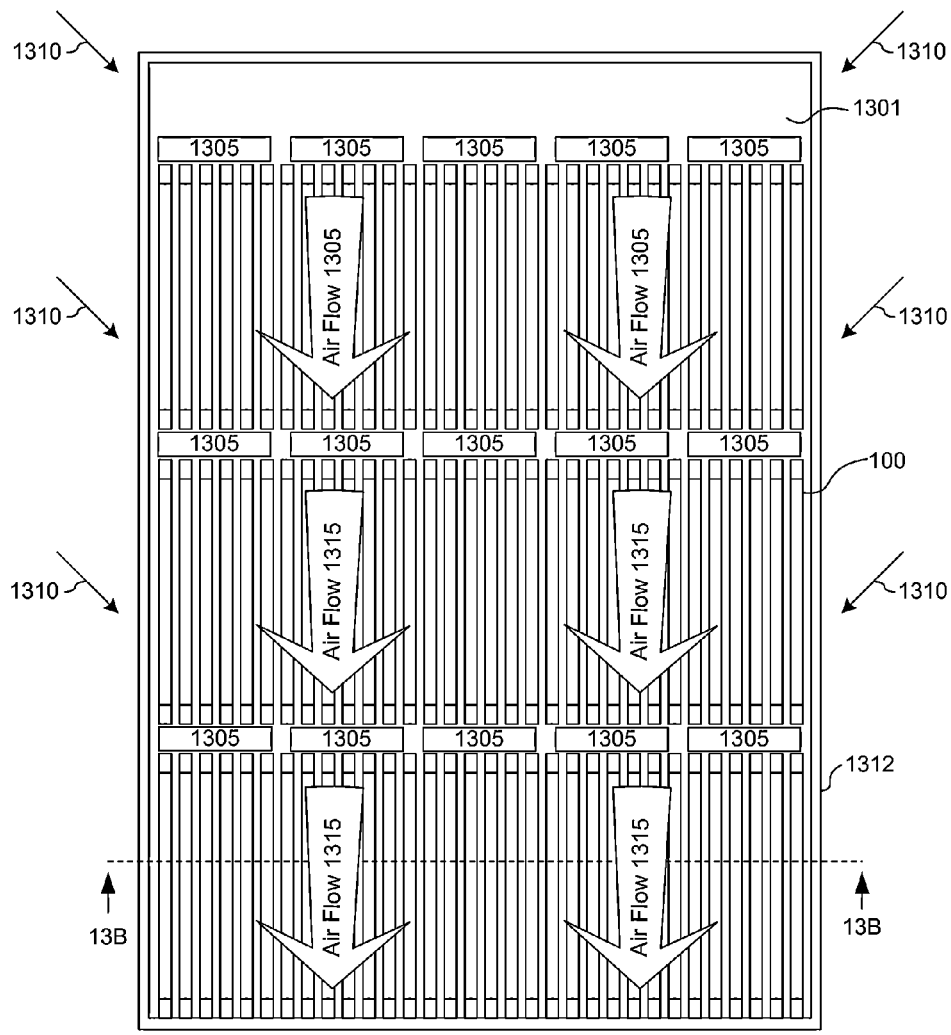
FIG. 13A is a mechanical diagram illustrating a circuit board in accordance with another embodiment disclosed within this specification.

FIG. 13A is a mechanical diagram illustrating a circuit board in accordance with another embodiment disclosed within this specification. FIG. 13A is top view of a circuit board 1301. Circuit board 1301 can be configured substantially similar to circuit board 401 described within this specification. As pictured in FIG. 13A, however, a plurality of fans 1305 can be mounted or attached to the same surface of circuit board 1301 to which processor modules 100 are attached. Each of fans 1305 can be powered by the power supply (not shown) that is included or attached to circuit board 1301, with power being routed through traces on circuit board 1301. As shown, fans 1305 can be positioned between rows of processor modules 100 to facilitate air flow between processor modules 100.

Arrows 1310 represent air flow that is directed into an enclosure 1312 that can be configured substantially similar to enclosure 410 and that can contain circuit board 1301. Enclosure 1312, for example, can be a 2U rack drawer that can fully enclose circuit board 1301. The air flow represented by arrows 1310 can be directed or sourced by plenums 1160-1185 illustrated and described with reference to FIG. 11. Enclosure 1312 further can include a plurality of ports (not shown) through which air from plenums 1160-1185 can be directed.

As shown, each of fans 1305 can be mounted so that the fan blades rotate in a plane that is substantially perpendicular to a plane of the surface of circuit board 1301. Each of fans 1305 also can be substantially perpendicular to a plane defined by processor modules 100. Processor modules 100, as shown, are also substantially perpendicular to the surface of circuit board 1301. In this position, each of fans 1305 can direct a flow of air over and between processor modules 100 as illustrated by arrows 1315 within enclosure 1312. Thus, air directed in the ports as represented by arrows 1310 can be directed, or redirected as the case may be, as shown by arrows 1315.

In an embodiment, the rotational speed of each of fans 1305 can be individually controlled. In another embodiment, the rotational speed of different groupings of fans 1305 can be controlled as a single unit. For example, each of the three different rows of fans 1305 can be controlled as a single unit. The rotational speed of fans 1305, whether controlled individually or in one or more groups, can be automatically adjusted under the control of a processor or other computer (not shown) to maintain a desired or constant temperature or airflow within enclosure 1312.

Figure 13B:
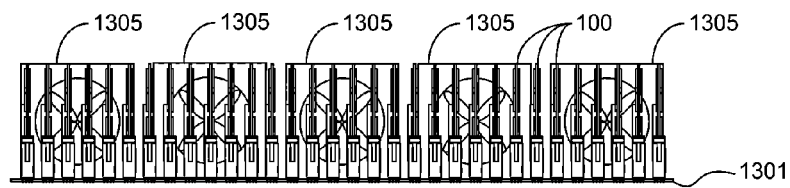
FIG. 13B is a mechanical diagram illustrating a cross-sectional view taken along cut-line 13B of FIG. 13A.

FIG. 13B is a mechanical diagram illustrating a cross-sectional view taken along cut-line 13B of FIG. 13A. More particularly, FIG. 13B illustrates a cross-sectional view of circuit board 1301 taken along cut-line 13B. As pictured, a row including a plurality of processor modules 100 can be mounted in connectors, e.g., sockets 402, that are attached to circuit board 1301. Located behind the row of processor modules 100 are five fans 1305 attached to circuit board 1301. Fans 1305 direct air between the respective ones of processor modules 100.

Figure 14:
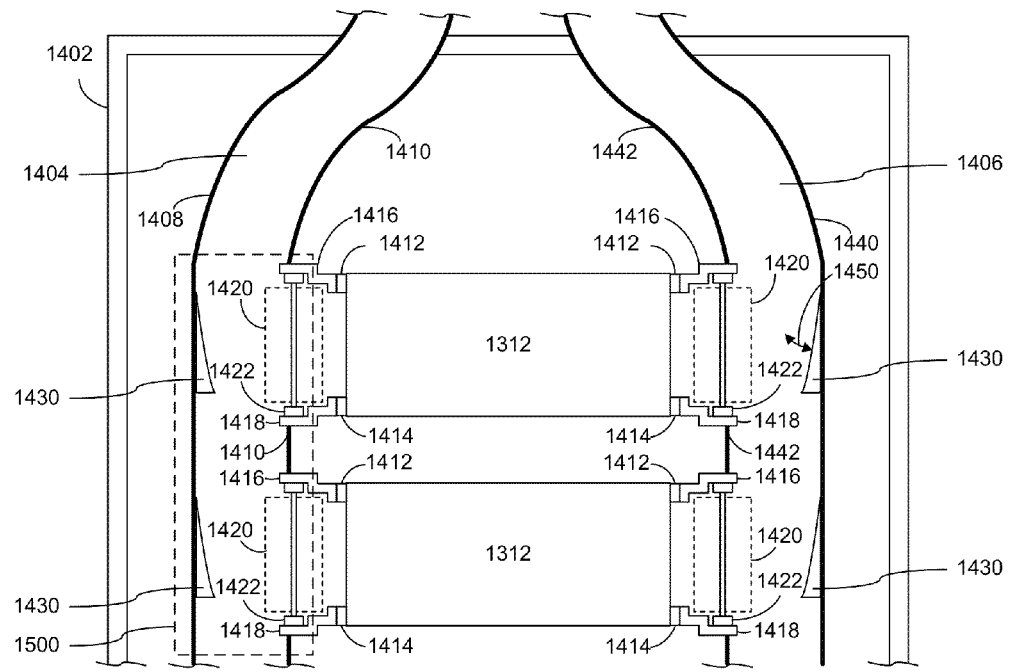
FIG. 14 is a block diagram illustrating a cross-sectional view of a plenum configuration for use with a system in accordance with another embodiment disclosed within this specification.

FIG. 14 is a block diagram illustrating a cross-sectional view of a plenum configuration for use with a system in accordance with another embodiment disclosed within this specification. FIG. 14 illustrates a plenum configuration, for example, that can be incorporated into a rack-based system for a computing system as illustrated in FIG. 13 or FIG. 4. The three dimensional coordinate system illustrates the orientation of the plenum configuration with the z-axis extending into the page. As pictured in FIG. 14, a case 1402, e.g., case 1105 or chassis 410, is illustrated as having plenums 1404 and 1406. Each of plenums 1404 and 1406 can extend out of a top portion of case 1402. Plenum 1404 can include an outer wall 1408 and an inner wall 1410. Inner wall 1410 can include a plurality of ports that allow airflow to be directed into the one or more of enclosures 1312 supported within case 1402. Plenum 1406 can include an outer wall 1440 and an inner wall 1442. Inner wall 1442 can include a plurality of ports that allow airflow to be directed into the one or more enclosures 1312 supported within case 1402. Within FIG. 14, plenums 1404 and 1406 are shown as extending out of the top portion of case 1402 as separate plenums. Though not shown, plenums 1404 and 1406 also can be configured to exit a bottom of case 1402. Airflow can be directed to exhaust out of one or more plenums or can be directed to exhaust or exit out a front of case 1402. In another embodiment, plenums 1404 and 1406 can join together into a single plenum and exit out of the top of case 1402 as a single plenum. Still, as noted, each of plenums 1404 and 1406 can be implemented completely independently if so desired with independent conditioned airflow sources directing conditioned air within each respective one of plenums 1404 and 1406.

Enclosures 1312, e.g., enclosure 410, can be supported on sliding rails 1412 and 1414. In an embodiment, sliding rails 1412 can be included for structural integrity to support enclosures 1312 sliding in and out of case 1402. Sliding rails 1412 and 1414 can be attached to upper brackets 1416 and lower brackets 1418 respectively. In one or more embodiments, seals can be used between enclosures 1312 and upper brackets 1416 and between enclosures 1312 and lower brackets 1418 to prevent air delivered from plenum 1404 or from plenum 1406 from leaking out of enclosure 1312. In an embodiment, airflow can be directed to exhaust out of a front portion of enclosure 1312.

Air flow from each of plenums 1404 and 1406 can be regulated using baffles 1420. Each of baffles 1420 can be mounted between upper brackets 1416 and lower brackets 1418. Each of baffles 1420 can be mounted so as to rotate in position. The dashed outline of each of baffles 1420 illustrates in the x-dimension an open position in which air flow from plenums 1404 and 1406 can flow through the port into each of enclosures 1312 in a substantially unfettered manner. Each of baffles 1420 is substantially aligned with the direction of the air flow. When closed, each of baffles 1420 can substantially close air flow from plenums 1404 and 1406 into enclosures 1312.

In an embodiment, each of baffles 1420 can be rotated independently between an open position and a closed position using electrical motors 1422. It should be appreciated that electrical motors 1422 can rotate each of baffles 1420 to virtually any position between the open position and the closed position so as to achieve any of a variety of different amounts of air flow. In another embodiment, each of electrical motors 1422 can be controlled according to temperature. Using a computer system or other processor, electrical motors 1422 can be controlled to increase the size of the openings through the ports of plenums 1404 and 1406, e.g., open, by rotating baffles 1420 when increased air flow is needed for greater cooling, e.g., when temperature within case 1312 rises to or above a first minimum temperature. Electrical motors 1422 can be controlled to reduce the size of the openings through the ports of plenums 1404 and 1406, e.g., close, by rotating baffles 1420 when reduced air flow is needed for less cooling, e.g., when temperature within case 1312 decreases to or below a second minimum temperature.

It should be appreciated that a scale of temperature thresholds can be established to which a temperature reading or measurement taken within case 1312 is compared. Based upon where within the temperature scale the measured temperature falls, the location can be correlated with a baffle position. Electrical motors 1422 can be activated to rotate each of baffles 1420 to the position correlated with the measured temperature. A temperature sensor within each enclosure 1312, for example, can be linked to a control system. The baffles 1420 and various fans also can be coupled to the control system.

In another embodiment, electrical motors 1422, and thus, baffles 1420, can be controlled responsive to one or more baffle control factors. Examples of baffle control factors can include, but are not limited to, environmental conditions and the operational state of one or more components of case 1402 or the computing system therein. Environmental conditions can include, for example, temperature, airflow, and/or turbidity within case 1402 or within each of cases 1312. Operating conditions can include, for example, rotational speed of fans, the current positioning of baffles 1420, or the like. Electrical motors 1422 can be controlled using one or more of such baffle control factors or can be controlled according to a mathematical expression that depends upon one or more of such factors. Further, it should be appreciated that each electrical motor 1422 can be controlled according to baffle control factors that are system wide or according to baffle control factors specific to that particular electrical motor, e.g., according to temperature and fan speed of the particular case 1312 associated with that electrical motor 1422.

In another embodiment, control over various mechanical features such as fan speed and rotation of baffles can be assigned to one of processor modules 100 within one of enclosures 1312. For example, one processor module 100 within each enclosure 1312 can control rotation of baffles for that enclosure as well as rotational speed of fans disposed on the particular circuit board 1301 within that enclosure 1312.

A plurality of air foils 1430 can be attached to outer wall 1408 of plenum 1404 and to outer wall 1440 of plenum 1406. Each of air foils 1430 can help to direct air flow into each respective port of the inner wall 1410 of plenum 1404 and inner wall 1442 of plenum 1406. In one or more embodiments, each of air foils can be pivotally adjusted along directional arrow 1450. For example, each of air foils 1430 can be coupled to an electrical motor and hinged so as to facilitate the increasing or decreasing of the angle formed between the air foils 1430 and outer wall 1408 or outer wall 1440 as the case may be. It should be appreciated that each of air foils 1430 can be manually adjusted in lieu of automated adjustment. While shown mounted vertically, air foils 1430 can be mounted in a horizontal orientation or formed with a complex shape as dictated by plenum design and/or design for airflow and turbidity. The positioning of air foils 1430, whether collectively or individually, can be further examples of baffle control factors.

When increased air flow is needed within a selected enclosure 1312, the air foil 1430 immediately to the right and/or left of the selected enclosure 1312 can be adjusted to increase the angle between that air foil 1430 and outer wall 1408 and/or 1440 as the case may be. When less air flow is needed, air foils 1430 can be adjusted to reduce the angle formed between outer wall 1408 and/or 1440. It should be appreciated that movement of air foils 1430 can be performed in combination with the opening and/or closing of baffles 1420. Further, the positioning of air foils 1430 and baffles 1420 can be coordinated with the airflow, temperature, turbidity, speed of fans operating within cases 1312, e.g., fans 1305 of FIG. 13, or the like.

Figure 15:
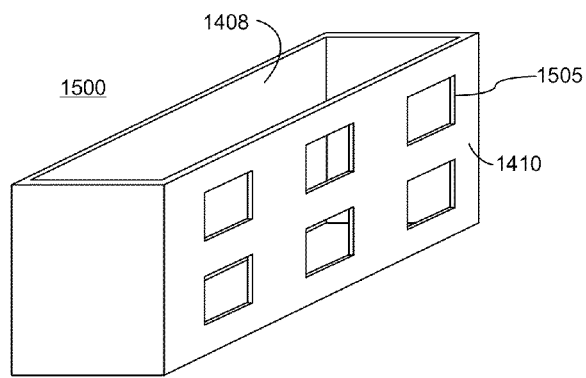
FIG. 15 is a cross-sectional, perspective view illustrating the plenum architecture of FIG. 14 in accordance with another embodiment disclosed within this specification.

FIG. 15 is a cross-sectional, perspective view illustrating the plenum architecture of FIG. 14 in accordance with another embodiment disclosed within this specification. FIG. 15 illustrates a section of plenum 1404 defined according to dashed bounding box 1500 in FIG. 14. The orientation of the section of plenum 1404 relative to FIG. 14 by can be seen with reference to the three-dimensional coordinate system shown. FIG. 15 illustrates the various ports 1505 that can be positioned in inner wall 1410. The assembly including a baffle 1420 rotatably attached to a bracketing system can be attached and located within each of ports 1505. The example illustrated in FIG. 15 shows one larger plenum structure that can be located on each side of enclosures 1312 as shown in FIG. 14.

In another embodiment, each column of ports 1505 can correspond to a single plenum. Thus, referring to FIG. 15, three separate and independent plenum columns can be used to cool each of enclosures 1312 as depicted in FIG. 12, for example. Each of the three columns can have a single row of ports as opposed to multiple ports in each row as shown. Further, each column can, for example, receive airflow from a same source or, in the alternative, a different airflow source that is independently controllable.

The one or more embodiments disclosed within this specification provide computing systems and rack systems that can be used in a variety of applications. The computing systems can be dynamically reconfigured according to need. In this regard, the computing systems can be dynamically reconfigured in terms of computing functionality (e.g., programming), networking, storage, and/or the physical circuitry used within various modules of the computing systems. Further, the computing systems provide significant density of computational and storage resources in a form factor that also facilitates reduced power consumption, reduced heat generation, and greater ease of maintenance and administration, e.g., through module replacement, particularly when compared with conventional enterprise systems.

The figures illustrate the architecture, functionality, and operation of possible implementations of systems and methods according to one or more embodiments disclosed within this specification. It should be noted that, in some alternative implementations, the functions noted in the figures may occur out of the order shown. For example, two blocks shown in succession may, in fact, be executed or performed substantially concurrently, or the blocks may sometimes be executed in the reverse order, depending upon the functionality involved. It also should be noted that each block of the diagrams, and combinations of blocks in the diagrams, can be implemented by special purpose hardware-based systems that perform the specified functions or acts, or combinations of special purpose hardware and executable instructions.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A processor module comprising:
   a circuit board;
   a first programmable circuitry coupled to the circuit board, wherein the first programmable circuitry is configurable to implement different physical circuits;
   a processor configured to execute program code, wherein the processor is coupled to the circuit board and to the first programmable circuitry;
   a plurality of random access memory (RAM) devices coupled to the circuit board and electrically coupled to the first programmable circuitry, wherein the plurality of RAM devices are coupled to the first programmable circuitry to form a plurality of parallel channels of the plurality of RAM devices; and
   an interface coupled to the circuit board and electrically coupled to the first programmable circuitry for coupling input and output between the first programmable circuitry and external circuitry;
   wherein the first programmable circuitry is configured to include a multi-port memory controller coupled to the plurality of RAM devices.

2. The processor module of claim 1, wherein the interface is a card-edge connector that is configured to be coupled to a socket of a device, wherein the processor module is configured for insertion into the socket for adding additional processors to the device, and wherein the processor module can be removed from the socket for removing processors from the device.

3. The processor module of claim 1, further comprising:
   a flash memory coupled to the circuit board and electrically coupled to the first programmable circuitry.

4. The processor module of claim 3, wherein the flash memory is configured to store configuration data specifying at least one circuit design for implementation within the first programmable circuitry.

5. The processor module of claim 1, wherein the first programmable circuitry is configured to implement one front side bus for each processor coupled to the circuit board, wherein each processor coupled to the circuit board couples to the first programmable circuitry through the front side bus.

6. The processor module of claim 1, wherein the first programmable circuitry is dynamically reconfigurable to implement different circuits corresponding to different applications.

7. The processor module of claim 1, further comprising:
   a second programmable circuitry located within a different integrated circuit device than the first programmable circuitry,
   wherein the first programmable circuitry electrically couples to a first set of the plurality of RAM devices and the second programmable circuitry electrically couples to a second set of the plurality of RAM devices,
   wherein the first programmable circuitry electrically couples to a first set of the plurality of processors and the second programmable circuitry electrically couples to a second set of the plurality of processors, and
   wherein the first programmable circuitry couples to the second programmable circuitry through a high speed serial interface.

8. The processor module of claim 1, wherein the first programmable circuitry and the processor are co-located within a same integrated circuit package.

9. The processor module of claim 1, wherein the first programmable circuitry and the processor are on a same substrate.

10. A computing system comprising:
    a first circuit board;
    a plurality of sockets coupled to the first circuit board;
    a connector coupled to each of the plurality of sockets configured to couple the plurality of sockets to external circuitry; and
    a plurality of processor modules, wherein each processor module is disposed within one of the plurality of sockets, and wherein each processor module comprises:
    a second circuit board;
    a first programmable circuitry, wherein the first programmable circuitry is coupled to the second circuit board and configured to implement different physical circuits;

a processor configured to execute program code, wherein the processor is coupled to the second circuit board and to the first programmable circuitry;

a plurality of random access memory (RAM) devices coupled to the second circuit board and electrically coupled to the first programmable circuitry, wherein the plurality of RAM devices are coupled to the first programmable circuitry to form a plurality of parallel channels of the plurality of RAM devices; and an interface electrically coupled to the second circuit board and to the first programmable circuitry, wherein each interface is configured to couple into one of the plurality of sockets for coupling input and output between the first programmable circuitry and the external circuitry: wherein the first programmable circuitry is configured to include a multi-port memory controller coupled to the plurality of RAM devices.

11. The computing system of claim 10, further comprising:
a plurality of fans coupled to the first circuit board.

12. The computing system of claim 11, wherein rotational speed of each fan is automatically controlled responsive to temperature.

13. The computing system of claim 10, further comprising:
a flash memory device coupled to the second circuit board and coupled to the first programmable circuitry.

14. The computing system of claim 10, wherein the flash memory device stores a circuit design to be formed within the first programmable circuitry responsive to loading the circuit design within the first programmable circuitry.

\* \* \* \* \*